United States Patent [19]
Markle

[11] Patent Number: 6,072,251
[45] Date of Patent: Jun. 6, 2000

[54] MAGNETICALLY POSITIONED X-Y STAGE HAVING SIX DEGREES OF FREEDOM

[75] Inventor: David A. Markle, Saratoga, Calif.

[73] Assignee: Ultratech Stepper, Inc., San Jose, Calif.

[21] Appl. No.: 09/273,814

[22] Filed: Mar. 22, 1999

Related U.S. Application Data

[63] Continuation-in-part of application No. 08/848,548, Apr. 28, 1997.

[51] Int. Cl.⁷ .................................................. H02K 41/02
[52] U.S. Cl. .............................. 310/12; 310/17; 414/935
[58] Field of Search ............................. 310/12, 13, 14, 310/15, 17; 335/302, 306; 414/935

[56] References Cited

U.S. PATENT DOCUMENTS

| | | | |
|---|---|---|---|
| 3,370,205 | 2/1968 | Dukes et al. .............................. | 317/123 |
| 4,184,188 | 1/1980 | Briglia ..................................... | 361/234 |
| 4,502,094 | 2/1985 | Lewin et al. .............................. | 361/234 |
| 4,520,421 | 5/1985 | Sakitani et al. .......................... | 361/234 |
| 4,556,362 | 12/1985 | Bahnck et al. ........................... | 414/744 |
| 4,618,292 | 10/1986 | Judge et al. .............................. | 406/19 |
| 4,624,617 | 11/1986 | Belna ....................................... | 414/347 |
| 4,761,579 | 8/1988 | Delassus .................................. | 310/90.5 |
| 4,790,258 | 12/1988 | Drage et al. .............................. | 118/500 |
| 4,877,123 | 10/1989 | Fukuwatari et al. ..................... | 198/619 |
| 5,019,863 | 5/1991 | Quimby ................................... | 335/210 |
| 5,080,380 | 1/1992 | Nakagawa et al. ........................ | 279/1 |
| 5,150,272 | 9/1992 | Danley et al. ............................ | 361/144 |
| 5,155,651 | 10/1992 | Yoda et al. ............................... | 361/144 |
| 5,196,745 | 3/1993 | Trumper .................................. | 310/12 |
| 5,207,437 | 5/1993 | Barnes et al. ............................. | 279/128 |
| 5,284,411 | 2/1994 | Enomoto et al. ......................... | 414/217 |
| 5,334,892 | 8/1994 | Chitayat .................................... | 310/1.2 |
| 5,359,490 | 10/1994 | Oguro ..................................... | 361/144 |
| 5,377,071 | 12/1994 | Moslehi ................................... | 361/234 |
| 5,383,049 | 1/1995 | Carr ......................................... | 359/283 |
| 5,417,537 | 5/1995 | Miller ....................................... | 414/217 |
| 5,420,556 | 5/1995 | Okazaki ................................... | 335/212 |
| 5,421,695 | 6/1995 | Kimura .................................... | 414/744.5 |
| 5,565,747 | 10/1996 | Sasaki et al. ............................. | 315/507 |
| 5,631,618 | 5/1997 | Trumper et al. ......................... | 335/299 |
| 5,723,917 | 3/1998 | Chitayat .................................... | 310/12 |

FOREIGN PATENT DOCUMENTS 480549  4/1992  European Pat. Off. ........ B65G 54/02

Primary Examiner—Nestor Ramirez
Assistant Examiner—Burton Mullins
Attorney, Agent, or Firm—Allston L. Jones

[57] ABSTRACT

The respective magnets of each of a plurality of spaced Halbach magnet arrays in both the X and Y directions that incorporate in the arrays in both directions, the magnets having a filed oriented parallel to the Z axis in alternately the positive and negative directions. The magnets in each array in each direction that are not shared by the crossing Halbach magnet arrays each has a horizontal field orientation parallel to either the X or the Y axis with the filed direction in each instance pointing toward the adjacent magnet having its filed oriented in the positive Z direction. Additionally, up to four layers of coils of wire in separate X-Y planes in substantially vertical alignment with each other contain coils each with a selected orientation relative to the X or Y axis such that they provide levitation, lateral motion, as well as roll, pitch and yaw adjustments to the magnet array forming an X-Y stage for precision positioning an object located on the top surface of the magnet.

35 Claims, 15 Drawing Sheets

Fig. 8

MAGNETICALLY POSITIONED X-Y STAGE HAVING SIX DEGREES OF FREEDOM

CROSS-REFERENCE

This patent application is a Continuation-In-Part application that claims priority from an earlier filed application having the same title and the same inventor, having Ser. No. 08/848,548 and filed on Apr. 28, 1997.

BACKGROUND OF THE INVENTION

1. Field of the Invention

This invention relates to an improved magnetic apparatus for precisely positioning an X-Y movable stage with respect to a fixed base and, more particularly, to such a stage suitable for use in a wafer-stepper employed in the photolithographic manufacture of monolithic integrated circuits.

2. Description of the Prior Art

In the past, stepper motors have been used for the purpose of positioning the X-Y stage of a wafer-stepper with six degrees of freedom. Recently, however, prior-art magnetic positioning apparatus has been developed for this purpose. This magnetic positioning apparatus provides substantially higher positioning resolution and other advantages over stepper motors. These other advantages include:

(1) the monolithic nature of such magnetic positioning apparatus allows direct coupling between the metrology system, the stage, and the wafer or substrate, (2) the direct electromagnetic coupling in all 6 axes eliminates the 25 needed for precision robbing, slow mechanisms such as focus actuators and coarse theta (yaw) adjustment mechanisms;

(3) the design of such magnetic positioning apparatus lends itself to a high bandwidth, servo controlled, positioning system that settles much faster (because of the higher bandwidth) than other types of positioning stage; and (4) such magnetic positioning apparatus is equally applicable to step-and-repeat or step-and-scan types of operation and does not exhibit cogging that inhibits travel at constant velocity with Sawyer motor based stages.

A first example of a prior-art magnetic positioning apparatus suitable for use in a wafer-stepper is disclosed in U.S. Pat. No. 5,196,745, issued Mar. 23, 1993. The magnetic positioning apparatus disclosed in U.S. Pat. No. 5,196,745 employs a plurality of stage-attached permanent magnetic arrays, each of which comprises a series of adjacent oppositely-poled permanent magnets (i.e., magnetic fields of each pair of adjacent magnets are rotated 180° with respect to one another) that cooperate with stationary electromagnetic coil arrays in the horizontal (X, Y) plane, to produce the proper lateral forces to provide desired motion of the X-Y stage in X and/or Y directions. Additional electromagnets provide controllable forces for levitating the stage-attached permanent magnetic arrays' forces in the vertical (Z) direction with respect to the stationary electromagnetic coil arrays to maintain a desired air gap therebetween and controllable couples for providing small angular rotations of the stage-attached permanent magnetic arrays about the X, Y and/or Z axes.

Known in the art is a so-called Halbach magnetic array, which comprises a series of permanent magnets in which the respective magnets are poled so that the magnetic fields of each pair of adjacent magnets are rotated 90° with respect to one another.

A second example of prior-art magnetic positioning apparatus for use in a wafer-stepper is shown in FIGS. 1 and 2 and is described in detail below. However, briefly, this second example comprises four spatially-separated Halbach magnetic arrays extending from each of the four corners of an X-Y stage, with each of the Halbach magnetic arrays cooperating with a stationary electromagnetic coil array in the horizontal (X, Y) plane, thereby achieving (1) controllable lateral forces in the X and Y horizontal directions and (2) controllable levitating forces in the vertical Z direction which are also capable of creating controllable couples for providing small angular rotations about the X, Y and/or Z axes. Thus, this second example of prior-art magnetic positioning apparatus differs from the above-described first example of prior-art magnetic positioning apparatus in that it does away with the need for the aforesaid additional electromagnets for providing both controllable levitating forces in the vertical Z and controllable couples for providing small angular rotations about the X, Y and/or Z axes.

Currently, wafers as large as 300 millimeters (mm) in diameter need to be processed. Thus, the overall horizontal area of the second example of the prior-art magnetic positioning apparatus for use in a wafer-stepper for processing 300 mm is very large (significantly greater than 4×4=16 square feet). The problem caused by this very large horizontal area is that it makes it very hard to adequately support the photolithographic projection optics, while also complicating the layout of the wafer-stepper.

SUMMARY OF THE INVENTION

The present invention provides a new configuration of Halbach magnet arrays and electromagnetic coils that leads to a much more compact and energy efficient X-Y stage, thereby solving the aforesaid problem.

More specifically, the present invention provides an improvement in apparatus for magnetically positioning a movable X-Y stage with respect to X and Y horizontal axes and a Z vertical axis. The improved apparatus comprises: (1) a first commutated coil of wire that lies substantially in a first horizontal X-Y plane and is angularly offset in the first horizontal X-Y plane by minus a first oblique angle with respect to said Y axis; (2) a second commutated coil of wire that lies substantially in a second horizontal X-Y plane substantially in vertical alignment with the first horizontal X-Y plane and angularly offset in said second horizontal X-Y plane by plus a second oblique angle with respect to the X axis; (3) a first set of a plurality of flat stationary electromagnetic coils of wire that lie substantially in the first horizontal X-Y plane mid-way between the windings of the first commutated coil of wire and are angularly offset in the first horizontal X-Y plane by minus the first oblique angle with respect to the Y axis; (4) a second set of a plurality of flat stationary electromagnetic coils of wire that lie substantially in the second horizontal X-Y plane mid-way between the windings of the second commutated coil of wire and are angularly offset in the second horizontal X-Y plane by minus the second oblique angle with respect to the X axis; (5) a two dimensional array of magnets including Halbach magnet arrays attached to the movable X-Y stage, wherein the array substantially lies in a third horizontal X-Y plane, is oriented substantially parallel to the same one of the X and Y horizontal axes with respect to which the first and second oblique angles are measured, and is simultaneously situated in a cooperative relationship with both of the first and second commutated coils of wire, and the first and second set of electromagnetic coils of wire; and (6) means for levitating the two dimensional array of magnets in the third X-Y plane.

A first embodiment of the magnet array defining an X-Y-Z coordinate system with each axis perpendicular to each other axis, each magnet having a particular magnetic field orientation and being substantially the same size and shape as every other magnet, the overall magnet array comprising: (1) a first Halbach magnet array, in the form of a first column in an X-Y plane aligned parallel to the Y-axis, the first Halbach magnet array having: (a) a first magnet oriented with the magnetic field extending vertically upward therefrom parallel to the Z-axis; (b) a second magnet adjacent the first magnet with the magnetic field extending horizontally away from the first magnet parallel to the Y-axis; (c) a third magnet adjacent the second magnet with the magnetic field extending vertically downward therefrom parallel to the Z-axis; and (d) a fourth magnet adjacent the third magnet with the magnetic field extending horizontally away from the third magnet parallel to the Y-axis; and (2) a second Halbach magnet array, in the form of a second column in the same X-Y plane as the first column, aligned parallel to the Y-axis and spaced apart from the first column a width of a single magnet in the direction of the X-axis, the second Halbach magnet array having: (a) a fifth magnet aligned opposite the first magnet in the first column with the magnetic field extending vertically downward therefrom parallel to the Z-axis; (b) a sixth magnet adjacent the fifth magnet and opposite the second magnet in the first column with the magnetic field extending horizontally toward the fifth magnet parallel to the Y-axis; (c) a seventh magnet adjacent the sixth magnet and opposite the second in the first column with the magnetic field extending vertically upward therefrom parallel to the Z-axis; and (d) an eighth magnet adjacent the seventh magnet and opposite the fourth magnet in the first column with the magnetic field extending horizontally away from the seventh magnet parallel to the Y-axis; wherein each magnet has an upper and a lower lateral extent in reference to the Y-axis with the upper and lower lateral extent of each magnet in the second column being aligned with the upper and lower lateral extent of the magnet in the first column that the second column is opposite.

A second embodiment of the magnet array defining an X-Y-Z coordinate system with each axis perpendicular to each other axis, each magnet having a particular magnetic field orientation and being substantially the same size and shape as every other magnet, said overall magnet array comprising: (1) a first Halbach magnet array, in the form of a first column in an X-Y plane aligned parallel to the Y-axis, the first Halbach magnet array having: (a) a first magnet oriented with the magnetic field extending vertically upward therefrom parallel to the Z-axis; (b) a second magnet adjacent the first magnet with the magnetic field extending horizontally toward the first magnet parallel to the Y-axis; (c) a third magnet adjacent the second magnet with the magnetic field extending vertically downward therefrom parallel to the Z-axis; and (d) a fourth magnet adjacent the third magnet with the magnetic field extending horizontally away from the third magnet parallel to the Y-axis; (2) a second Halbach magnet array, in the form of a second column in the same X-Y plane as the first column, aligned parallel to the Y-axis and spaced apart from the first column a width of a single magnet in the direction of the X-axis, the second Halbach magnet array having: (a) a fifth magnet aligned opposite the first magnet in the first column with the magnetic field extending vertically downward therefrom parallel to the Z-axis; (b) a sixth magnet adjacent the fifth magnet and opposite the second magnet in the first column with the magnetic field extending horizontally away from the fifth magnet parallel to the Y-axis; (c) a seventh magnet adjacent the sixth magnet and opposite the second in the first column with the magnetic field extending vertically upward therefrom parallel to the Z-axis; and (d) an eighth magnet adjacent the seventh magnet and opposite the fourth magnet in the first column with the magnetic field extending horizontally toward from the seventh magnet parallel to the Y-axis; (3) a third column of magnets in the same X-Y plane as the first and second columns, aligned parallel to the Y-axis and located between, and adjacent to, each of the first and second columns, the third column of magnets having: (a) a ninth magnet between, and adjacent, to both of the first and fifth magnets with the magnetic field extending horizontally toward the first magnet parallel to the X-axis; and (b) a tenth magnet between, and adjacent to, each of the third and seventh magnets with the magnetic field extending horizontally away from the third magnet parallel to the X-axis; and (4) a fourth column of magnets in the same X-Y plane as the first, second and third columns, aligned parallel to the Y-axis and located adjacent to the second column on the side of the second column away from the first column, the fourth column of magnets having: (a) an eleventh magnet adjacent to the fifth magnet with the magnetic field extending horizontally away from the fifth magnet parallel to the X-axis; and (b) a twelfth magnet adjacent to the seventh magnet with the magnetic field extending horizontally toward the seventh magnet parallel to the X-axis; wherein each of the magnets has an upper and a lower lateral extent in reference to the Y-axis with the upper and lower lateral extent of each magnet in the second column being aligned with the upper and lower lateral extent of the magnet in the first column that the second column is opposite, and the upper and lower lateral extent of the ninth, tenth, eleventh and twelfth magnets in the third and fourth columns, respectively, being aligned with the upper and lower lateral extent of each magnet in the first or second column that the magnet is the to be adjacent.

BRIEF DESCRIPTION OF THE DRAWINGS

FIG. 8 is a plan view of a two dimensional array of Halbach magnet arrays of a magnetically levitated X-Y stage in accordance with the principles of the second embodiment of the present invention;

DESCRIPTION OF THE PREFERRED EMBODIMENTS

Figure 1:
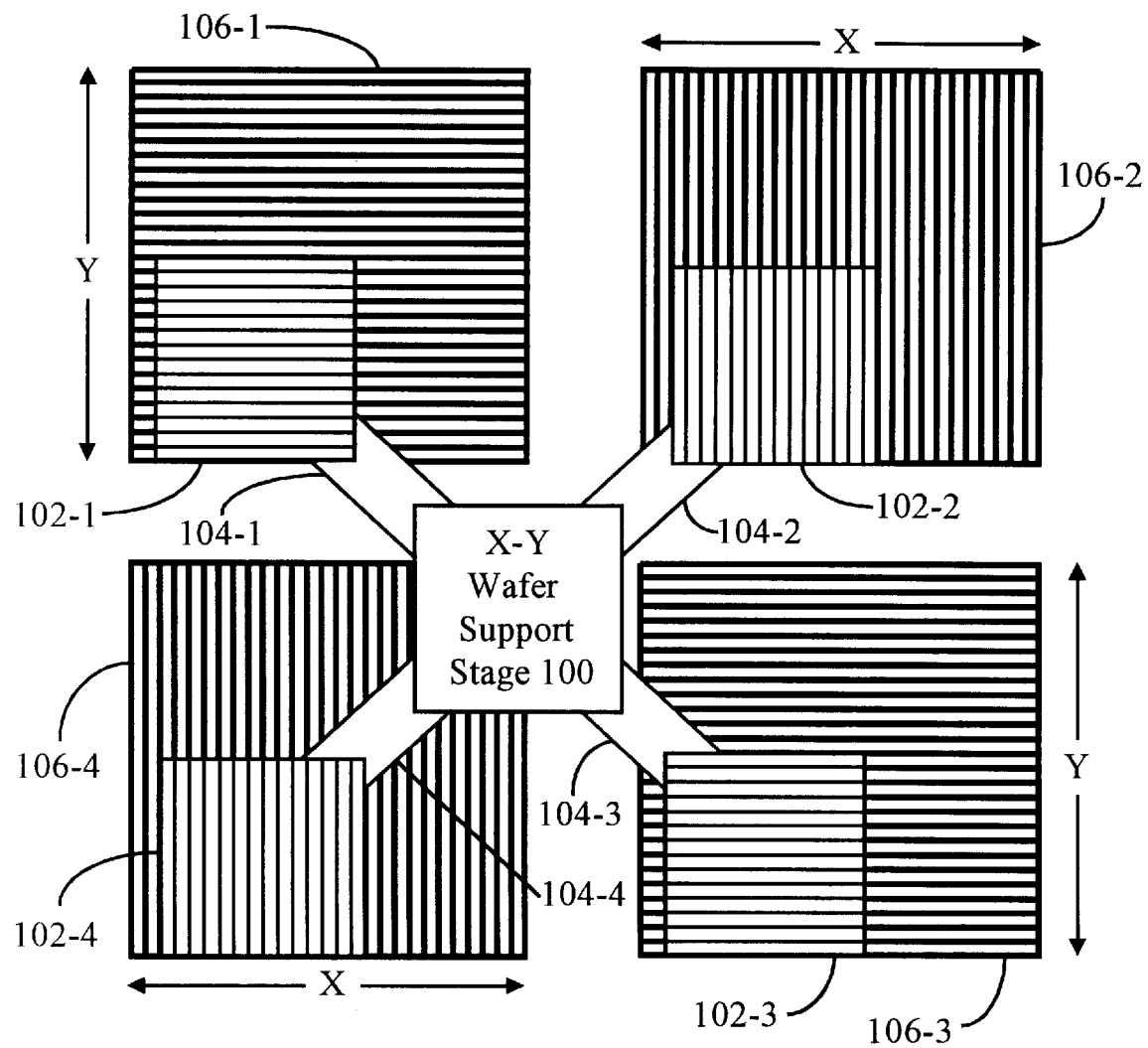
FIG. 1 schematically shows a plan view of the aforesaid second example of the prior-art magnetic positioning apparatus.

Referring to FIG. 1, there is schematically shown a plan view of prior-art apparatus for magnetically positioning the X-Y stage of a wafer-stepper with six degrees of freedom. This prior-art apparatus comprises (1) a movable structure which includes X-Y wafer support stage 100 having Halbach magnet array 102-1 attached to the upper-left corner of stage 100 by member 104-1, Halbach magnet array 102-2 attached to the upper-right corner of stage 100 by member 104-2, Halbach magnet array 102-3 attached to the lower-right corner of stage 100 by member 104-3 and Halbach magnet array 102-4 attached to the lower-left corner of stage 100 by member 104-4, and (2) four separate stationary single sets 106-1, 106-2, 106-3 and 106-4 of flat electromagnetic coils of wire, which, respectively, form first, second third and fourth cooperative configurations with corresponding ones of Halbach magnet arrays 102-1, 102-2, 102-3 and 102-4. Specifically, the wires of the single sets of stationary flat electromagnetic coils 106-1 and 106-3 extend parallel to the X axis of a substantially horizontal X, Y plane, while the wires of the single sets of stationary flat electromagnetic coils 106-2 and 106-4 extend parallel to the Y axis of this X, Y plane. Further, Halbach magnet arrays 102-1 and 102-3, which, respectively, cooperate with the single sets of flat stationary coils 106-1 and 106-3, are stacked parallel to the Y axis, while Halbach magnet arrays 102-2 and 102-4, which, respectively, cooperate with the single sets of stationary flat coils 106-2 and 106-4, are stacked parallel to the X axis. Each of Halbach arrays 102-1, 102-2, 102-3 and 102-4 is made up of adjacent rectangular magnets as shown in FIG. 1 with each magnet having a different polarity than either of the other adjacent magnets.

Figure 2:
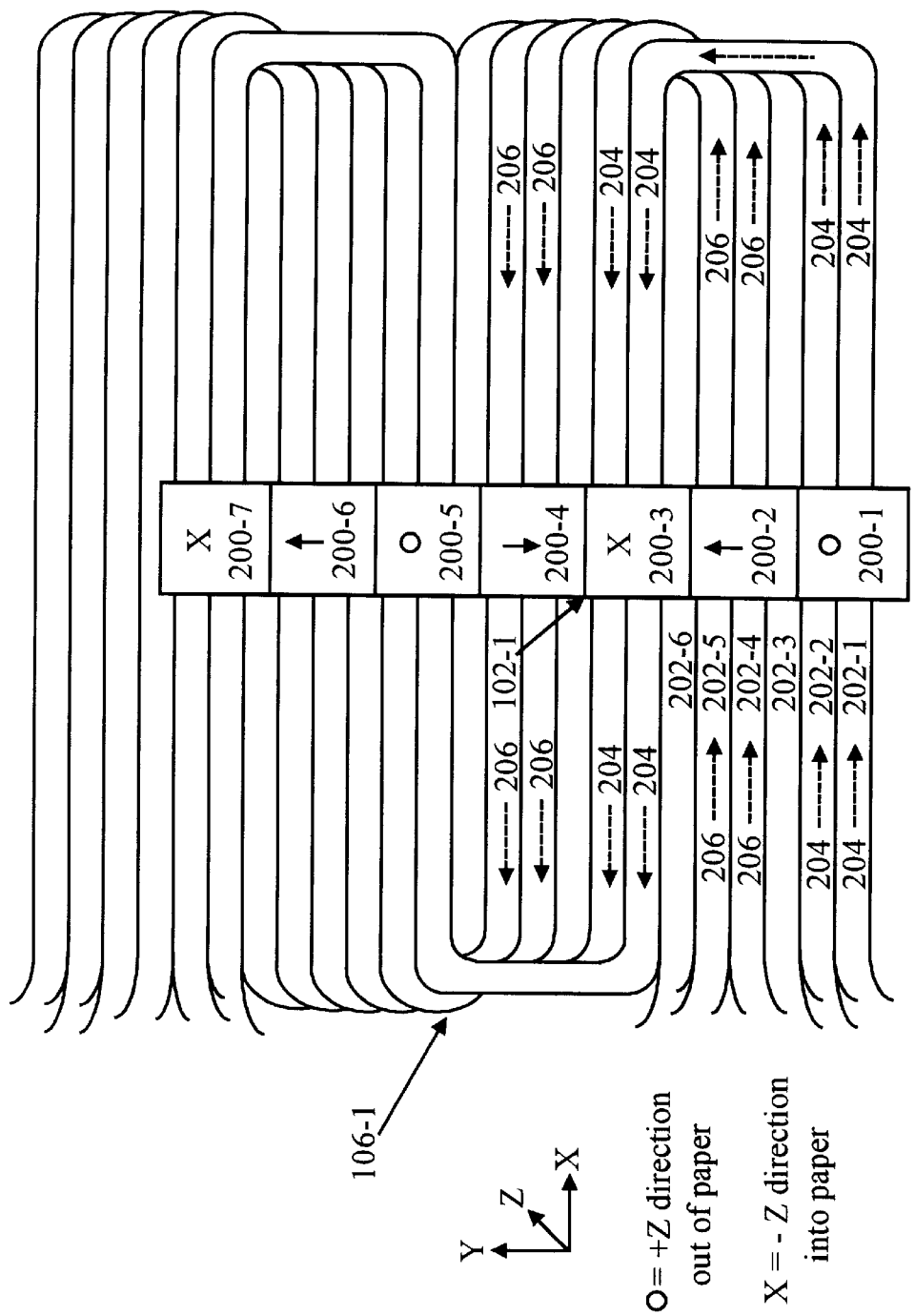
FIG. 2 illustrates the cooperative configuration of one of the Halbach magnet arrays with respect to its single set of electromagnetic coils that is employed in the prior-art magnetic positioning apparatus shown in FIG. 1.

FIG. 2, in more detail, exemplifies the cooperative configuration of Halbach magnet array 102-1 with respect to the single set of stationary flat electromagnetic coils 106-1. As shown in the FIG. 2 example, Halbach magnet array 102-1 comprises a stack of contiguous permanent magnets 200-1 ... 200-7 (truncated to being square for convenience of illustration in FIG. 2) extending in the Y direction, while the single set 106-1 comprises a plurality of six, side-by-side, equispaced stationary flat electromagnetic coil wires 202-1 ... 202-6 extending in the Y direction in an X, Y plane situated below Halbach magnet array 102-1. The distance between successive passes across the platen for each one of coil wires 202-1 ... 202-6 is assumed in the FIG. 2 example to be substantially equal to the extent in the Y direction of two adjacent contiguous magnets of Halbach array 102-1. Further, as known in the art, the phase and magnitude of current energizing each individual one of coil wires 202-1 ... 202-6 may be continuously determined by a computer-controlled servo metrology system responsive to fed back values of the X, Y, and Z position coordinates of X-Y stage 100 at each instant of time.

Each of Halbach array magnets 200-1 and 200-5 is poled with its north pole on the top of the magnet and its south pole on the bottom of the magnet, so that its magnetic field within the magnet extends in the Z direction and emerges from the top of the magnet. Each of magnets 200-3 and 200-7 is poled with its north pole on the bottom of the magnet and its south pole on the top of the magnet, so that its magnetic field within the magnet extends in the Z direction and emerges from the bottom of the magnet. As indicated by the direction of their arrow, magnets 200-2 and 200-6 are poled with their north pole on that face thereof which, respectively, interfaces a face of magnets 200-3 and 200-7 and with their south pole on that face thereof which, respectively, interfaces a face of magnets 200-1 and 200-5, so that their magnetic fields within the magnets extends in the Y direction of their arrows. Similarly, magnet 200-4 is poled with its north pole on that face thereof which interfaces a face of magnet 200-3 and with its south pole on that face thereof which interfaces a face of magnet 200-5, so that its magnetic field within the magnet extends in a Y direction which (as indicted by its arrow direction) is opposite to the Y direction of the magnetic fields of magnets 200-2 and 200-6. The effect of Halbach magnet array 102-1, taken as a whole with its magnets 200-1 ... 200-7 poled as shown in FIG. 2, tends to cancel the array's magnetic field in the region above the array and tends to double the array's resultant magnetic field intensity in the region below the array (where interaction with the respective magnetic fields of electromagnetic coils 202-1 . . . 202-6 takes place).

Forces on Halbach magnet array 102-1 may be selectively generated in accordance with the phase and magnitude of current energizing the wire of each of electromagnetic coils 202-1 . . . 202-6. More particularly, with Halbach magnet array 102-1 being positioned with respect to the set of electromagnetic coils 106-1 as shown in FIG. 2, respective energizing currents, having the phase indicated by arrows 204, in each of coils 202-1 and 202-2 (which generate magnetic fields which interact with the magnetic fields of magnets 200-1, 200-3, 200-5 and 200-7) will generate a lateral force on array 102-1 that causes array 102-1 to move toward the top of the paper in the Y direction (right hand rule). Similarly, respective energizing currents, having the phase indicated by arrows 206, in each of coils 202-4 and 202-5 (which generate magnetic fields which interact with the magnetic fields of magnets 200-2, 200-4, and 200-6) will generate a levitating force on array 102-1 that causes array 102-1 to move upward in the Z direction. Because, in the position shown in FIG. 2, each of coils 202-3 and 202-6 straddles each of pairs of adjacent magnets of array 102-1, no energizing current is applied to coils 202-3 and 202-6 at this time. However, as array 102-1 moves toward the top of the paper in the Y direction, the respective currents energizing the electromagnetic coils of set 106-1 are commutated so that (1) those magnetic fields which interact with the magnetic fields of magnets 200-1, 200-3, 200-5 and 200-7 continue to generate a lateral force on array 102-1 that causes array 102-1 to move toward the top of the paper in the Y direction; (2) those magnetic fields which interact with the magnetic fields of magnets 200-2, 200-4, and 200-6 will continue to generate a levitating force on array 102-1 that causes array 102-1 to move upward in the Z direction; and (3) no energizing current is applied to those coils that straddle a pair of adjacent magnets of array 102-1.

In the case of the lateral force on array 102-1, it is apparent that array 102-1 can be caused to move toward the bottom of the paper in the Y direction by reversing the phase of the current energizing those electromagnetic coils of set 106-1 which are then generating magnetic fields that interact with the magnetic fields of magnets 200-1, 200-3, 200-5 and 200-7 from that indicated by arrows 204. Further, the force and, therefore, the acceleration of movement toward the top or bottom of the paper as the case may be, is determined by the magnitude of these energizing currents.

If the entire levitating force results from the interaction of the magnetic fields then being generated by those electromagnetic coils of set 106-1 with the magnetic fields of magnets 200-2, 200-4, and 200-6, the amount array 102-1 is levitated is determined by a servo system controlling the magnitude of the current energizing those electromagnetic coils of set 106-1. Because, in practice, the levitated movable structure is often quite heavy (e.g., the case in FIG. 1), the required magnitude of this energizing current becomes relatively large. To lower the required magnitude of the energizing current in this case, a fixed biasing levitating force may be provided by permanent magnets (not shown), and the fixed biasing levitating force may be varied slightly by adding thereto a small up or down force in the Z direction produced by the interaction of the magnetic fields then being generated by those electromagnetic coils of set 106-1 with the magnetic fields of magnets 200-2, 200-4, and 200-6. In the case where the force of the permanent magnets just balances the weight of X-Y stage 100, the phase of the energizing levitation current is reversible and its magnitude is relatively small.

Returning to FIG. 1, it is apparent that, individually, each of the second, third and fourth cooperative configurations of respective Halbach magnet arrays 102-2, 102-3 and 102-4 with respect to the respective single sets of stationary flat electromagnetic coils 106-2, 106-3 and 106-4, operates in a manner which is similar to the operation of the above-described first cooperative configuration of Halbach magnet array 102-1 with respect to the single set of stationary flat electromagnetic coils 106-1. However, by individually selecting the appropriate phase and magnitude of each energizing current applied to each of the wires of each set of electromagnetic coils 106-1, 106-2, 106-3 and 106-4, these four cooperative configurations, operating together, are capable of (1) providing forces for translationally positioning X-Y wafer support stage 100 with respect to each of the X and Y axes over relatively large ranges, and (2) providing couples for rotationally positioning X-Y wafer support stage 100 about each of the X tilt axis, the Y tilt axis and the Z yaw axis over relatively small ranges, and (3) providing relatively small motion in the Z axis direction. However, in order to provide these required six degrees of freedom in the positioning of stage 100, an excessive area is occupied by an embodiment of the FIG. 1 X-Y wafer support stage positioning system of a size sufficient to support a large-diameter (e.g., 200 to 300 mm) wafer.

Figure 4:
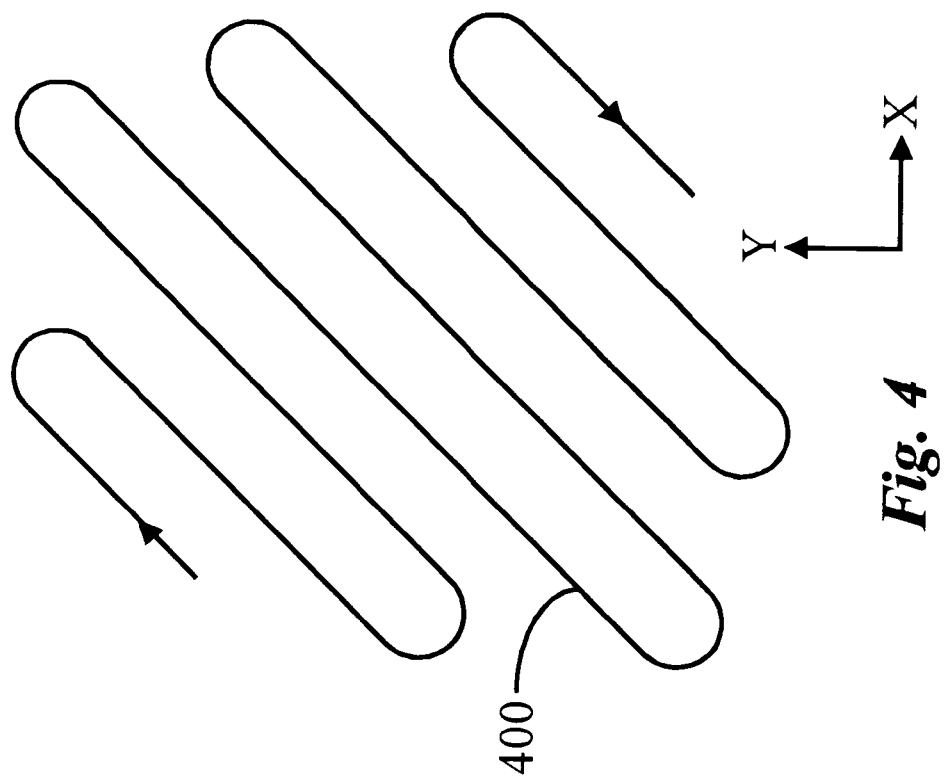
FIG. 4 illustrates the angular orientation of one of a second set of electromagnetic coils, all having the same angular orientation, in accordance with the principles of the first embodiment of the present invention.
Figure 3:
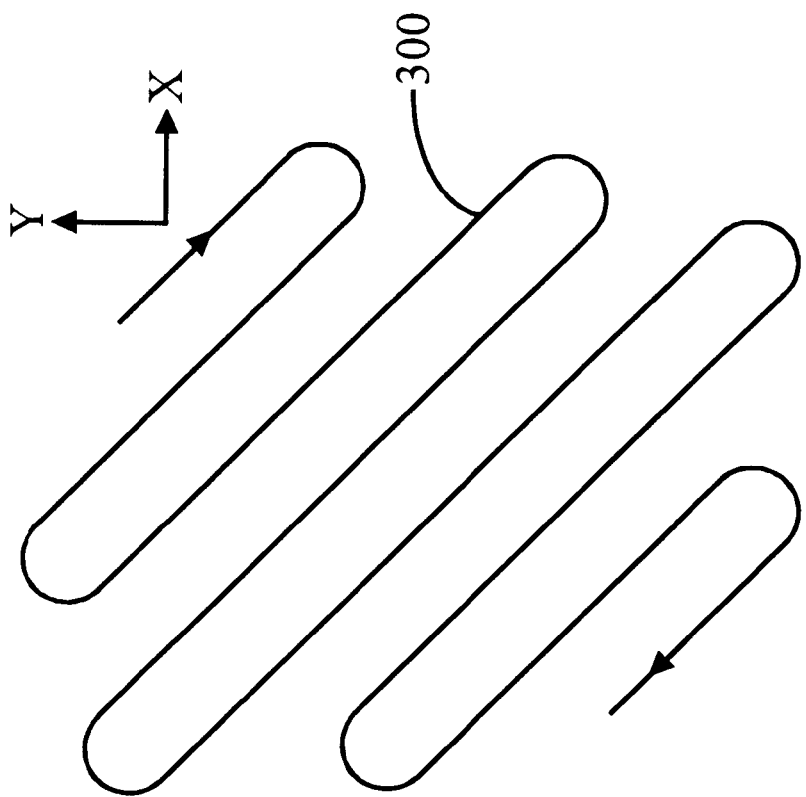
FIG. 3 illustrates the angular orientation of one of a first set of electromagnetic coils, all having the same angular orientation, in accordance with the principles of the first embodiment of the present invention.
Figure 5:
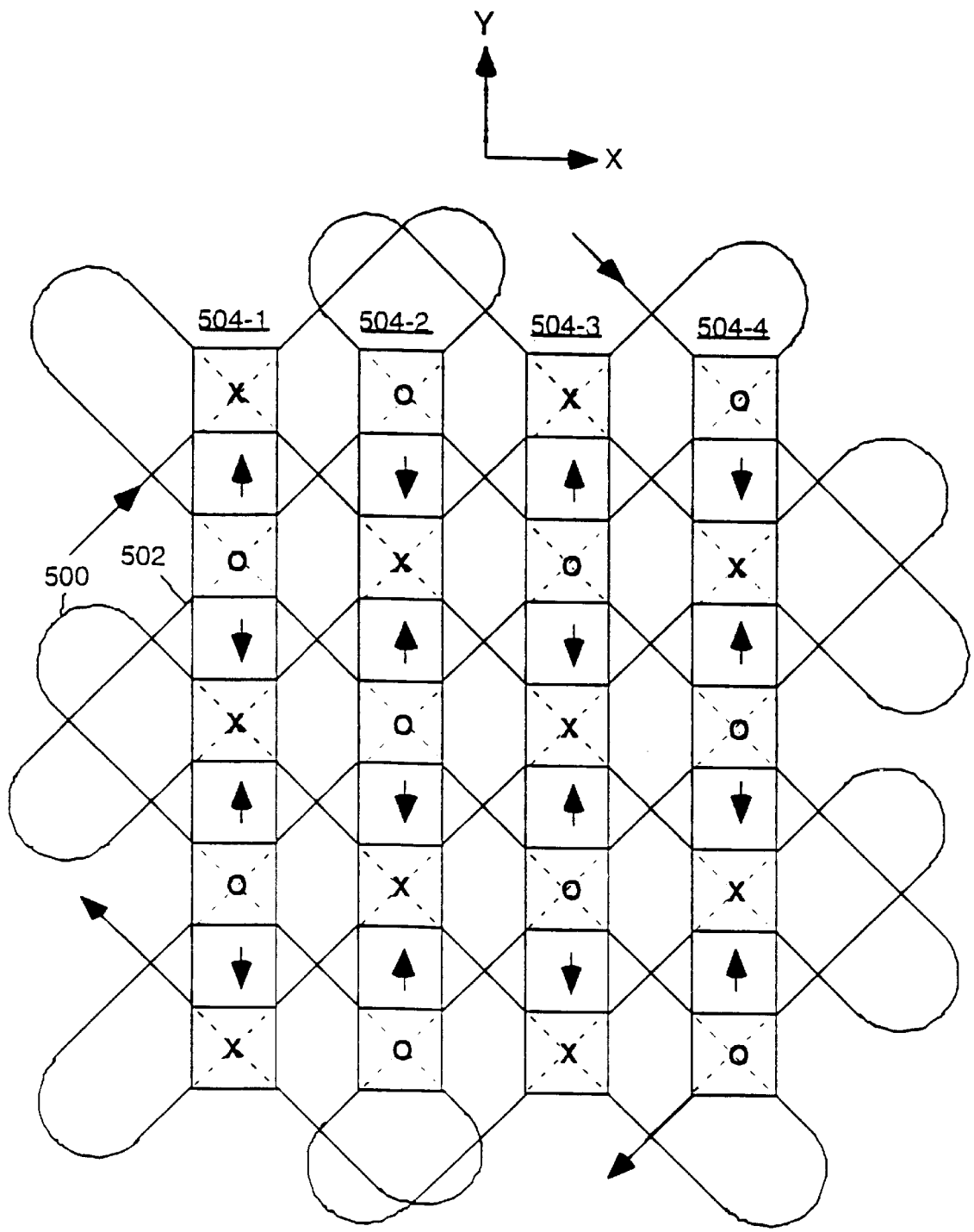
FIG. 5 is a plan view illustrating the cooperative spatial relationship among the Halbach magnet arrays, the one of the first set of electromagnetic coils of FIG. 3, and the one of the second set of electromagnetic coils of FIG. 4, in accordance with the principles of the first embodiment of the present invention.

FIGS. 3, 4 and 5 are employed to teach the principles of the magnetic positioning system of the present invention for an X-Y wafer support stage, wherein both of the first and second sets of stationary flat electromagnetic coil wires are configured to cooperate, together, with the same set of one or more movable Halbach magnet arrays. This results in a much more compact X-Y wafer support stage positioning system than that shown in FIG. 1. More specifically, (1) each of the first set of stationary flat electromagnetic coil wires substantially lies in an X, Y plane and is offset at a given plus oblique angle with respect to the Y axis (preferably at a +45° angle, as exemplified by flat electromagnetic coil wire 300 shown in FIG. 3), and (2) each of the second set of stationary flat electromagnetic coil wires substantially also lies in an X, Y plane and is offset at a given minus oblique angle with respect to the Y axis (preferably at a −45° angle, as exemplified by flat electromagnetic coil wire 400 shown in FIG. 4). For the purpose of clarity in the drawing, FIG. 5 exemplifies the cooperative relationship of only a particular one of the +45° electromagnetic coil wires 500 of the first set and a corresponding one of the −45° electromagnetic coil wires 502 of the second set with a set of four Halbach magnet arrays 504-1, 504-2, 504-3 and 504-4. As shown in FIG. 5, each of these four arrays is aligned parallel to the Y axis and is separated parallel to the X axis from an adjacent array by an amount equal to the width of the cross-section of each magnet of an array (each of the magnets shown in FIG. 5 having a square cross-section). Further, the respective magnetic poling of the magnets of arrays 504-2 and 504-4 is offset from the respective magnetic poling of the magnets of arrays 504-1 and 504-3 by twice the length of the cross-section of the magnets. Thus, with the four movable Halbach magnet arrays being positioned relative to each other and coil wires 500 and 502 as shown in FIG. 5, both coil wires 500 and 502 are situated below and in a cooperative spatial relationship with those magnets of all four Halbach magnet arrays having magnetic fields within these magnets that extend in the Z direction and result in a lateral force being produced. One or more additional pairs of corresponding electromagnetic coil wires (not shown) of the first and second sets may be situated in cooperative spatial relationship with those magnets of all four Halbach magnet arrays that result in a lateral force being produced, while at least one pair of corresponding electromagnetic coil wires (not shown) of the first and second sets is situated in cooperative spatial relationship with those magnets of all four Halbach magnet arrays that are poled to produce a levitating force.

It is apparent that a first diagonally-directed lateral force will be produced by the interaction of coil wire 500 with the magnets of all four Halbach magnet arrays in a direction determined by the phase of the energizing current applied to coil wire 500, and this first lateral force comprises a first component parallel to the X axis and a second component parallel to the Y axis. Similarly, a second diagonally-directed lateral force will be produced by the interaction of coil wire 502 with the magnets of all four Halbach magnet arrays in a direction determined by the phase of the energizing current applied to coil wire 502, and this second lateral force also comprises a first component parallel to the X axis and a second component parallel to the Y axis. Further, each of the energizing currents applied, respectively, to coil wire 500 and coil wire 502 may have an independently selectable magnitude and either selectable one of two alternative phases. Thus, a resultant lateral force for accelerating the four movable Halbach magnet arrays in any direction in the X, Y plane may be produced by suitably selecting the respective phases and magnitudes of the energizing currents applied to coil wires 500 and 502.

Similarly, a resultant vertical force for levitating the four movable Halbach magnet arrays by any desired amount may be produced by suitably selecting the respective phases and magnitudes of the energizing currents applied to those unshown electromagnetic coil wires of each of the first and second sets that are situated in cooperative spatial relationship with those magnets of the Halbach magnet arrays that are poled to produce a force perpendicular to the plane of the paper.

In the preferred case shown in FIG. 5, the cross-section of each of the permanent magnets of the Halbach magnet arrays is a square and coil wires 500 and 502 are inclined, respectively, at +45° and −45° with respect to the Y axis. Thus, in this preferred case, the X and Y components of the individual diagonal lateral forces produced, respectively, by coil wires 500 and 502 are equal in magnitude to one another for acceleration in the X and/or Y directions. However, more generally, all that is required is that the shape of the cross-section of each of the magnets of the Halbach magnet arrays be symmetrical with respect to each of the X and Y axes. This includes, by way of examples, magnets with rectangular, circular or elliptical cross-sections. If the array of identically-poled magnets forms a rectangular, rather than a square, grid, then the orientation of the wires must be changed so that a wire passing through the center of one magnet also traverses the center of the other similarly oriented magnets. Therefore, in this latter case, it is necessary to appropriately adjust the relative magnitudes of the energizing currents applied, respectively, to the lateral-force producing coil wires of each of the first and second sets in order to compensate for the fact that the X and Y components of lateral force are inherently unequal in magnitude to one another. Further, electromagnets may be substituted for the permanent magnets of the Halbach magnet arrays.

Figure 6:
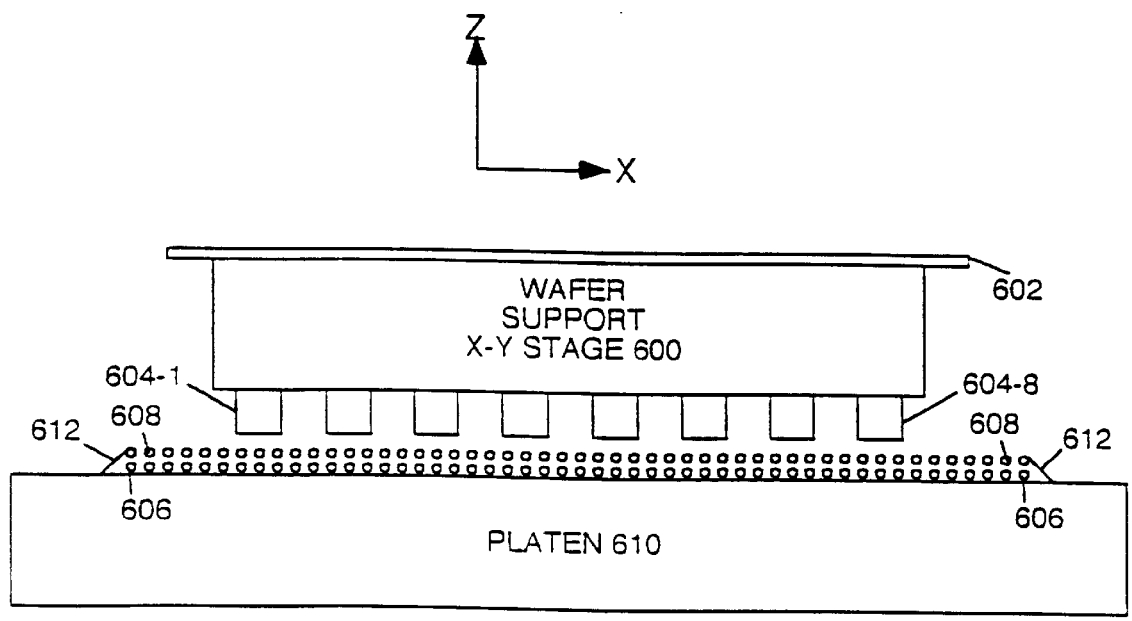
FIG. 6 shows a first preferred embodiment of the present invention, which illustrates a side view of the spatial configuration among the wafer, wafer support X-Y stage, and the magnetic positioning apparatus therefor.
Figure 7:
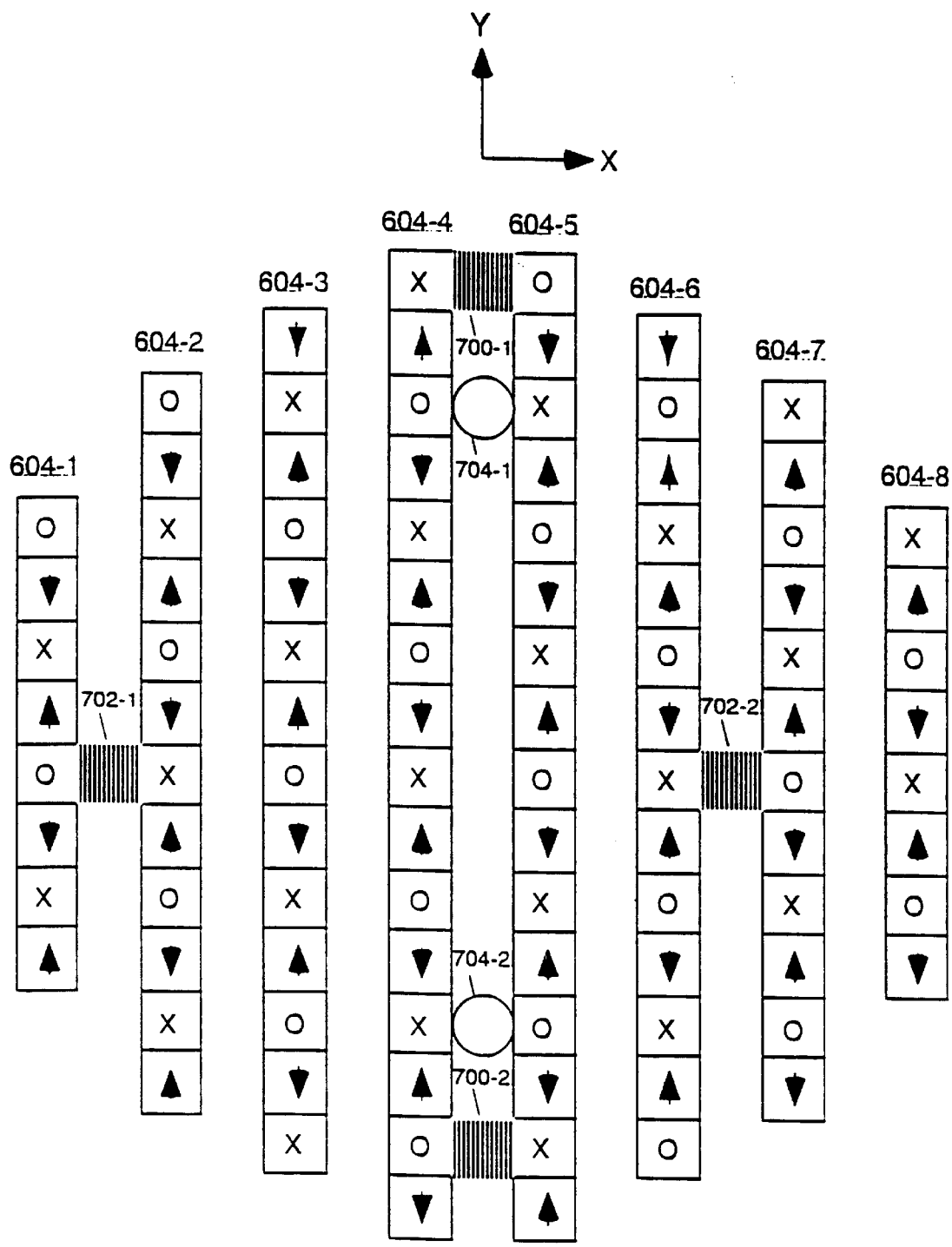
FIG. 7 is a plan view of the configuration of the magnets, including the Halbach magnet arrays, that are physically attached to the wafer support X-Y stage of the first preferred embodiment of the present invention shown in FIG. 6.

FIGS. 6 and 7, taken together, show one embodiment of the present invention for an X-Y stage preferably having a circularly-shaped cross-section. Shown in FIG. 6 is movable wafer support X-Y stage 600, in the form of a foreshortened circular cylinder that is as light and stiff as possible (although, in general, the foreshortened cylinder need not have a circularly-shaped cross-section). Wafer 602 is clamped to the circular top surface of stage 600 by means of a vacuum or electrostatic interface (not shown) that operates as a 30 wafer chuck. Typically this top surface is lapped flat to a micron or so. Attached to the circular bottom surface (which is also flat) of stage 600 are eight Halbach magnet arrays 604-1 . . . 604-8 (shown in more detail in FIG. 7, discussed below). Lower wire layer 606 and upper wire layer 608, respectively, comprise a first set of six stationary flat electromagnetic coil wires oriented as shown in FIG. 3 and a second set of six stationary flat electromagnetic coil wires oriented as shown in FIG. 4. Similar to the single set of six coil wires shown in prior-art FIG. 2, the six coil wires of the first set comprising layer 606 and the six coil wires of the second set comprising layer 608 can all be commutated independently of one another. While it is to be preferred that each of the first and second sets includes six coil wires, as few as four independently-commutated coil wires for each of the first and second set would suffice. Also, first and second wire layers 606 and 608, which are firmly attached to a heavy, stiff ferromagnetic platen 610 by means of a non-magnetic adhesive 612, are spatially situated to be in cooperative relationship with movable arrays 604-1 . . . 604-8. Therefore, in accordance with the above-described principles of the present invention, selectable lateral and levitation forces for translationally moving movable stage 600 parallel to the X, Y and/or Z axes may be produced.

Referring now to FIG. 7, each of Halbach permanent magnet arrays 604-1 . . . 604-8 is oriented parallel to the Y axis, with adjacent ones of these arrays being spaced from one another parallel to the X axis by the width of an array magnet. In particular, each of arrays 604-1 and 604-8 comprises eight permanent magnets; each of arrays 604-2 and 604-7 comprises twelve permanent magnets; each of arrays 604-3 and 604-6 comprises fourteen permanent magnets, and each of arrays 604-4 and 604-5 comprises sixteen permanent magnets.

Further, FIG. 7 comprises small cylindrical electromagnetic coil pairs 700-1 and 700-2, 702-1 and 702-2 and 704-1 and 704-2 for use in rotationally adjusting the angular position of X-Y stage 600 about one or more of the X, Y and Z axes over a relatively small angular range. This configuration assumes that the weight of wafer stage 600 is not entirely balanced by permanent magnets and that some steady-state current is required for levitation from the control electronics for the stage. This provides a means for coils 700-1, 700-2, 702-1, 702-2, 704-1 and 704-2 to interact with the steady-state current and, thereby, provide pitch, roll and yaw correction. Coils 700-1, 700-2, 702-1 and 702-2 are all oriented to generate respective magnetic fields parallel to the X axis which cooperate with the magnetic fields generated by the coil wires of the first and second set to produce respective forces parallel to the Z axis. Spatially displaced coils 700-1 and 700-2, both situated within the gap between arrays 604-4 and 604-5, are energized by currents of opposite phases and equal magnitudes to produce thereby a couple for tilting X-Y stage 600 about the X axis. Coil 702-1, situated within the gap between arrays 604-1 and 604-2 and spatially displaced coil 702-2, situated within the gap between arrays 604-6 and 604-7, are energized by currents of opposite phases and equal magnitudes to produce thereby a couple for tilting X-Y stage 600 about the Y axis. Spatially displaced coils 704-1 and 704-2, both situated within the gap between arrays 604-4 and 604-5, are (1) oriented to generate respective magnetic fields parallel to the Z axis which cooperate with the magnetic fields generated by the coil wires of the first and second set to produce respective forces parallel to the X axis, and (2) are energized by currents of opposite phases and equal magnitudes to produce thereby a couple for yawing X-Y stage 600 about the Z axis. Thus, the three pairs of small coil pairs 700-1 and 700-2, 702-1 and 702-2 and 704-1 and 704-2 can be used to control the three angular degrees of freedom of X-Y stage 600. Although the torques produced are limited by the size of these coils to small values, this is acceptable because the angular accelerations required by the wafer support X-Y stage of a wafer stepper are normally very small and, therefore, only sufficient torque is required to maintain angular stability.

One of the advantages of the one dimensional array of Halbach magnet arrays of FIGS. 5 and 7 is that the magnetic fields on the side toward platen 610 (FIG. 6) are nearly doubled and the magnetic fields on the side toward wafer 602 (FIG. 6) are nearly canceled. The second embodiment of the present invention incorporates additional magnets as a part of the X-Y stage thus creating a two dimensional array of Halbach magnet arrays, which uses the same principle as in the first embodiment, that further strengthens the magnetic field on one side and provides even more cancellation of the magnetic field on the other side. In addition, the magnet arrangement of the second embodiment of the present invention is also ideally suited to construct a two dimensional stage and that magnet array is shown in FIG. 8.

Figure 8:
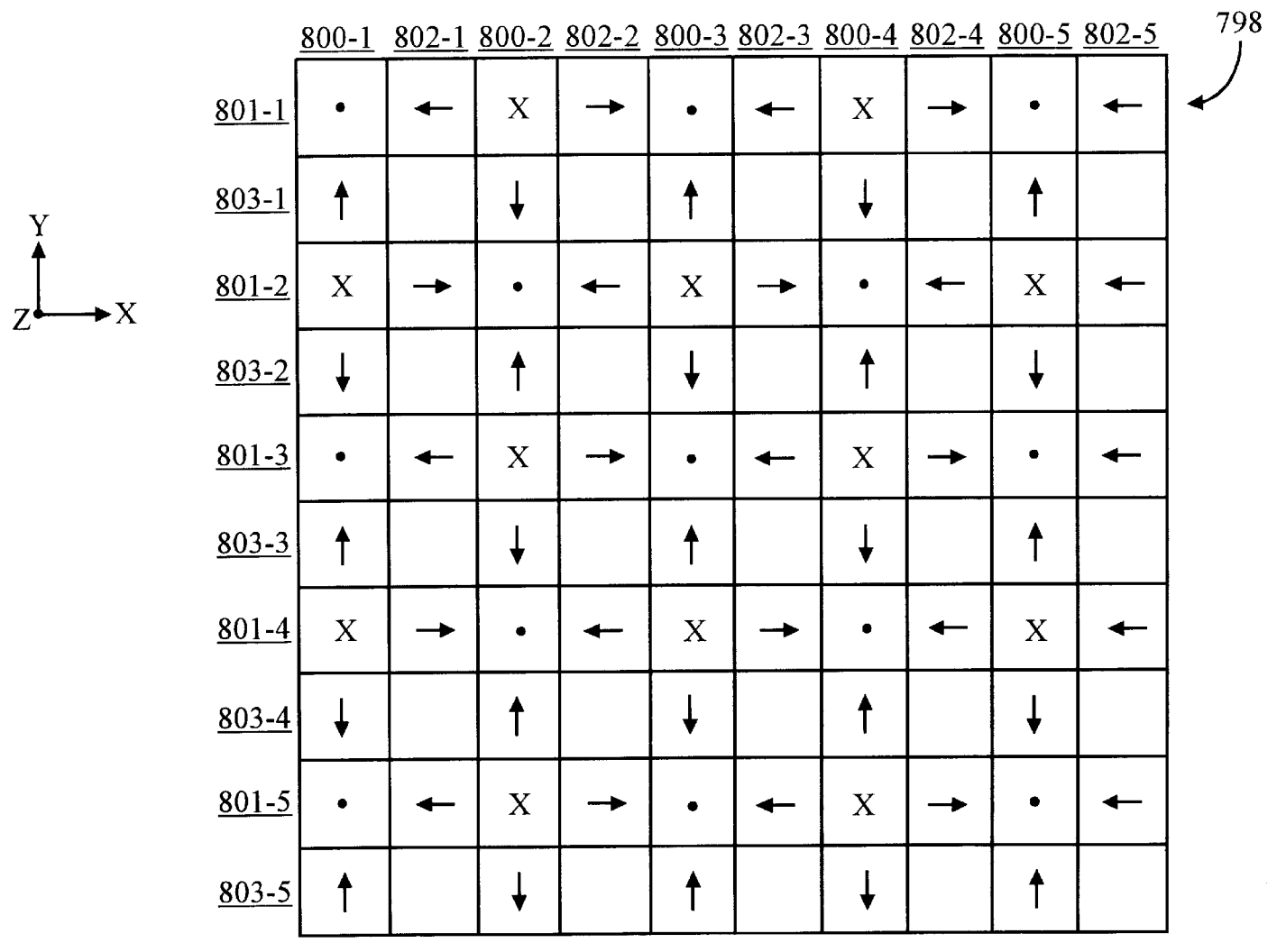

In FIG. 8 the two dimensional array of Halbach magnet arrays of X-Y stage 798 of the second embodiment is shown having two types of alternating adjacent magnet arrays, 800-x and 802-x when viewed from the perspective of the X-axis, and two types of magnet arrays 803-x and 805-x when viewed from the Y-axis, with all magnets having a square cross-section in each axis, X, Y and Z (out of the page toward the reader). In this view there is shown, specifically, five alternating adjacent rows of each of the two types of magnet arrays, 800-x and 802-x, namely arrays 800-1, 802-1, 800-2, 802-2, 800-3, 802-3, 800-4, 802-4, 800-5 and 802-5, and a similar configuration when viewed from the Y-axis with arrays 801-x and 803-x.

Each of arrays 800-x is an individual Halbach magnet array similar to arrays 504-x (FIG. 5) and 604-x (FIG. 7) of the first embodiment with one change from the first embodiment arrays. That change being that the magnets with the magnetic field that is horizontally oriented along the Y-axis are reversed. Also, each of the orientations of the magnetic fields of each magnet in arrays 800-x have a repeating set of orientations, namely, . . ., positive Z, positive Y, negative Z, negative Y, . . . . Additionally, the first magnet in each of arrays 800-x alternate between having a positive Z oriented field and a negative Z oriented field. Stated differently, each of the magnets having a positive Z oriented field are in a line at 45° with respect to the X-axis, and each magnet having a negative Z oriented field being in a 45° line that is off-set from the line through the magnets with the positive Z oriented field.

Arrays 802-x consist of an array alternating between a magnet and a magnet sized blank space, with each of the magnets adjacent the magnets having a Z axis oriented field in arrays 800-x. In addition, each of the magnets in arrays 802-x have an X-axis oriented field directed toward a magnet having a positive Z oriented field in one of the adjacent 800-x magnet arrays.

When viewed from the Y-axis of X-Y stage 798, the configuration of magnets in each of arrays 801-x are identical to those of arrays 800-x. This is also true for the configuration of arrays 803-x and arrays 802-x. Thus, each of arrays 800-x and 801-x is a Halbach magnet array that is perpendicular to the other and with common component magnets, namely those magnets having either a positive or a negative Z oriented field. Further, those magnets in arrays 802-x which are extra magnets when viewed from an X-axis perspective, are the magnets having an X oriented field in each of the Halbach magnet arrays 801-x when view from the Y-axis. Similarly, the magnets in arrays 803-x which are extra magnets between each Halbach magnet array when viewed from the Y-axis are the magnets having a Y oriented field in each of the Halbach magnet arrays 800-x. Therefore, the array of magnets for the second embodiment of the present invention is a two dimensional array of Halbach magnet arrays when viewed from the X and axis of X-Y stage 798.

Figures 9A, 9B:
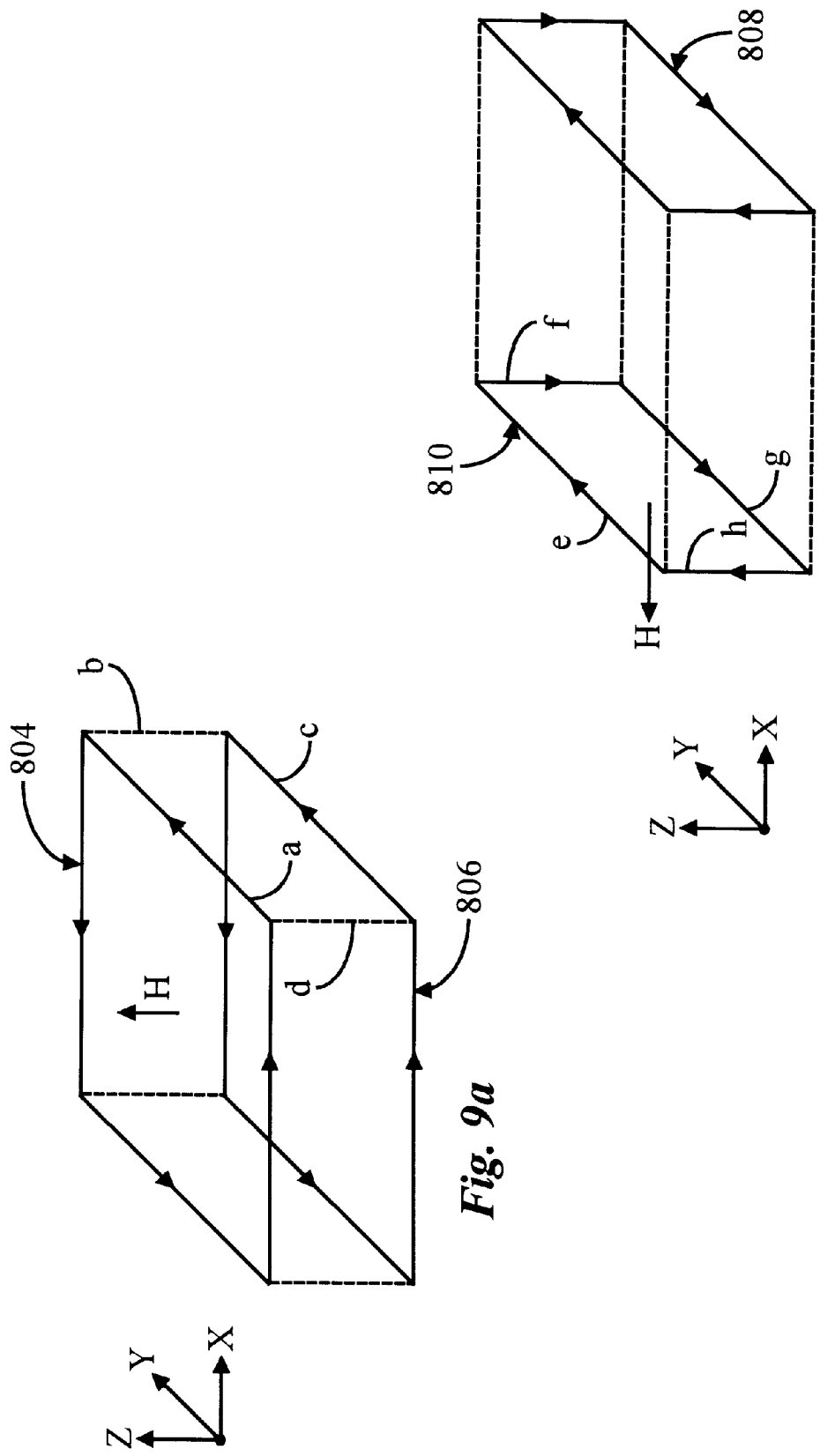
FIG. 9a is a perspective view of an edge coil representation of one of the magnets of a Halbach array having a positive vertical magnetic field.
FIG. 9b is a perspective view of an edge coil representation of one of the magnets of a Halbach array having a negative horizontal magnetic field.

The properties of the particular arrangement of magnets in FIG. 8, including the cancellation and reenforcement of magnetic fields at various points of X-Y stage 798, can more easily be seen from an approximation of each magnet by a pair of wire coils, one at each edge of the two poles on the magnet. This approximation is well known and can be derived by assuming that each pole face is covered with small coils that generate the corresponding magnetic field. FIG. 9a illustrates how two coils can be used to approximate a field produced in the plus Z axis direction by applying a current to coils 804 and 806 in the direction of the arrows by virtue of the accepted right-hand rule. Similarly, to create a magnetic field that is oriented in the negative Z axis direction, the current in both of coils 804 and 806 would be reversed from that shown in FIG. 9a. Similarly, FIG. 9b illustrates a two coil approximation of a magnet having a field oriented parallel to either the X or Y axis. Specifically, shown in FIG. 9b is the creation of a magnetic field in the negative X- axis direction by applying a current to coils 808 and 810 as shown. The creation of a magnetic field in the direction of the positive X-axis is simply done by reversing the current in coils 808 and 810. It can also be visualized from FIG. 9b how magnetic fields oriented in either the positive or negative Y-axis directions can be simulated by placing coils 808 and 810 on the front and back of the broken outline of the extent of the magnet being simulated.

If the magnets being simulated in FIGS. 9a and 9b were moved horizontally to be adjacent to each other (e.g., as are the top magnet in each of arrays 880-1 and 802-1 in FIG. 8) then the adding and subtracting of magnetic fields can easily be visualized. To that end, the edges of the right side of the magnet being simulated have been labeled a, b, c and d, and similarly the edges of the left side of the magnet being simulated in FIG. 9b have been labeled e, f, g and h. In so doing then it can be seen that, the current in coil segments a and e are in the same direction, thus doubling the filed effect along that combined edge when the two are adjacent each other. Since edges b and d have no current flowing in them, the only field producing current is thus produced in edges f and h with each having a singular influence. Finally, when edges c and g are observed it is observed that the current are in opposing directions to each other, thus the filed produced on that shared edge between the two simulated magnets is nulled.

Figure 10:
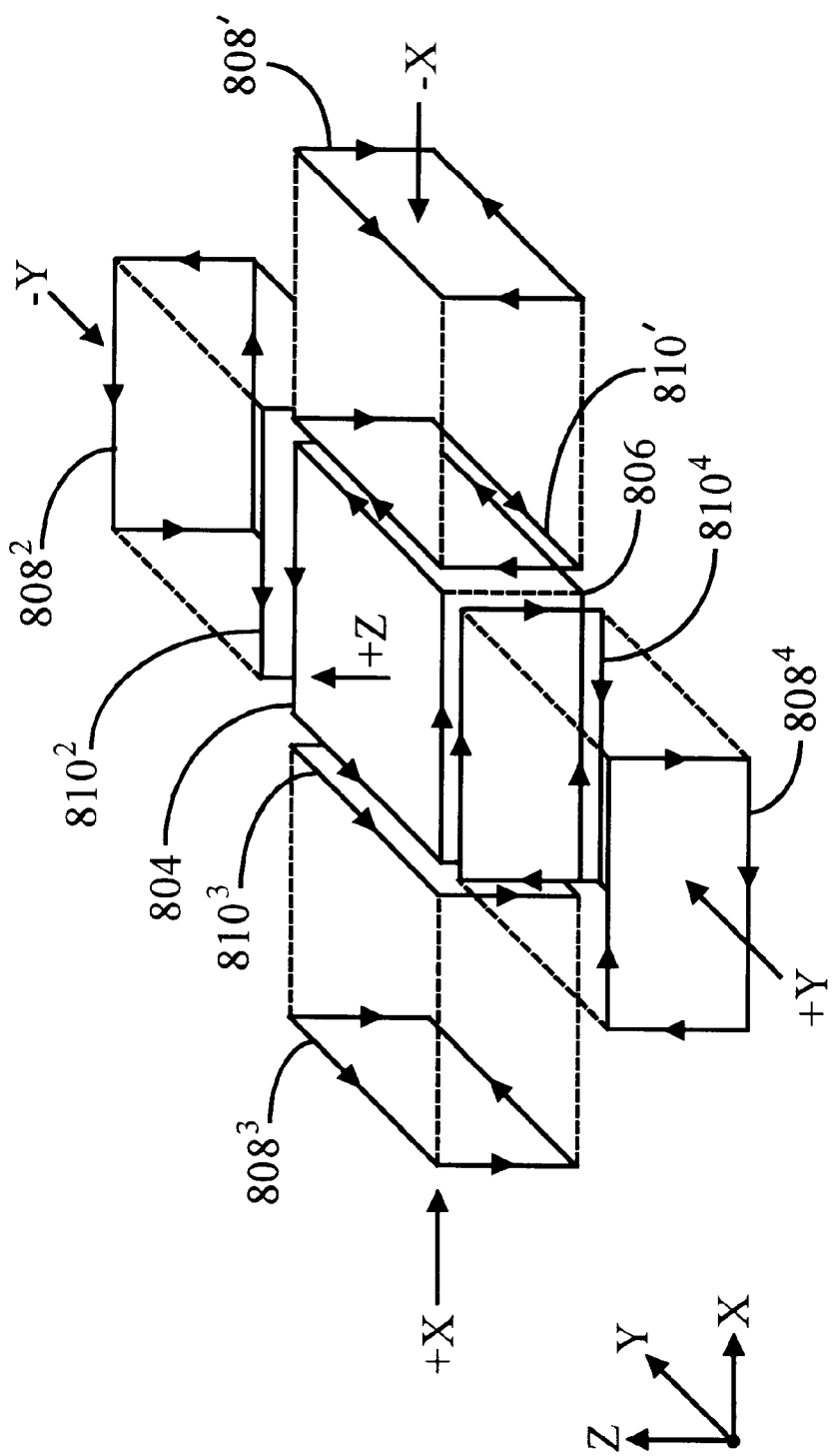
FIG. 10 is a perspective view of an edge coil representations of five magnets from the two dimensional array of Halbach magnet arrays of FIG. 8 with a central magnet having a positive vertical magnetic field surround, in the same plane, by one magnet on each of the four sides of the central magnet each having a horizontal magnetic field that extends into the respective side of the central magnet in accordance with the second embodiment of the present invention.

Then in FIG. 10, using the simulation technique of FIGS. 9a and 9b, illustrates the interaction of the magnetic fields of each of the five magnets in each cross in the array of FIG. 8. Here, a cross with a positive Z field in the center and horizontal fields all directed into the simulated central magnet is illustrated. The center magnet is shown simulated with coils 804 and 806, and each of the adjacent interfacing magnets are simulated with corresponding coil pairs 808$^1$ and 810$^1$, 808$^2$ and 810$^2$, 808$^3$ and 810$^3$, and 808$^4$ and 810$^4$. A similar simulation can be made for a cross with the field of the center magnet being in the negative Z axis direction and the fields of each of the adjacent magnets being away from the center magnet by reversing all of the currents in each of coils 804, 806, 808$^1$, 810$^1$, 808$^2$, 810$^2$, 808$^3$, 810$^3$, 808$^4$ and 810$^4$. Noting that the interface between the simulated central magnet and each of the adjacent magnets is the same interface as was discussed above with respect to FIGS. 9a and 9b the following observations can be made. First, it can be seen that the current around the top edge of the central magnet is complemented by the current in the adjacent top edge of each of the other magnets thus effectively doubling the field effect on all four top edges of the central magnet. Similarly, at the bottom of the central magnet all the currents in the bottom edge of each of the adjacent magnets is in the opposite direction to the currents in the edges of the bottom coil of the central magnet, thus effectively nulling the field produced at each of those bottom edges of the central magnet. Finally, considering the four vertical edges of the simulated central magnet it can be seen from FIG. 9a that no fields are produced on those edges of the central magnet, however, each of the adjacent simulated magnets does have a current in the vertical edges. Since each of the adjacent magnets is oriented with a horizontal field being directed into each of the sides of the central magnet, the simulated adjacent magnets each have an end coil with a clockwise current flow in this example. Thus, at each vertical edge of the central magnet there are opposing currents contributed by the two adjacent magnets that share a corner of the central magnet producing a null magnetic effect.

Since this effect is produced at each crossing of the Halbach arrays in the X and Y directions of FIG. 8, the two dimensional array of Halbach magnet arrays can double the field produced in the vertical direction by a single magnet on one side while canceling the vertical field on the other side of the overall array of magnets.

Figure 11:
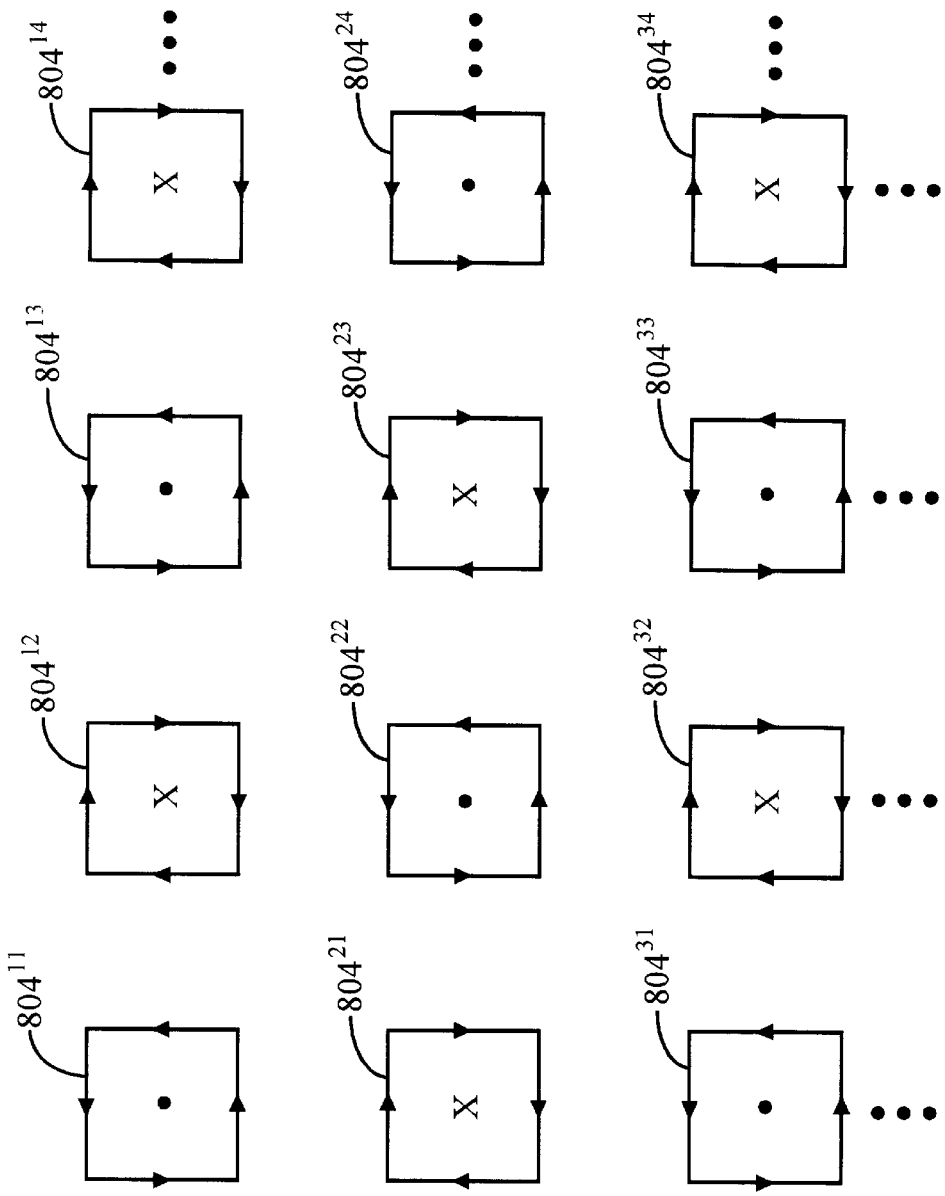
FIG. 11 is a plan view of a current loop approximation of a section of the two dimensional array of Halbach magnet arrays of FIG. 8.

Thus the magnetic field on one side of the two dimensional array of Halbach magnet arrays of FIG. 8 can be roughly approximated by a very simple array of current loops 804$^{11}$, 804$^{12}$, 804$^{13}$, 804$^{14}$, ..., 804$^{21}$, 804$^{22}$, 804$^{23}$, 804$^{24}$, ..., 804$^{31}$, ..., 804$^{32}$, ..., 804$^{33}$, ..., and 804$^{34}$, ..., as shown in FIG. 11.

In the second embodiment of the present invention, the inclusion of the extra magnets of arrays 802-x when viewed from the perspective of the X-axis, or arrays 803-x when viewed from the perspective of the Y-axis (see FIG. 8) when compared to the empty rows between the Halbach magnet arrays in the first embodiment (see FIG. 5), in addition to creating a two dimensional array of Halbach magnet arrays, these extra magnets increase the vertical field components, which are used to move the stage laterally, by a factor of 8/6 on one side of the overall array and reduce the vertical field components to close to zero on the other side of the overall array. The 8/6 ratio can be seen from FIG. 10 and the accompanying discussion. In FIG. 10 for the second embodiment it can be seen that the field effect at the top of the central magnet is simulated by 8 current carrying line segments: the four line segments in the top coil of the central magnet, and one line segment from each of the adjacent magnets, for a total of 8 line segments. If a similar representation of the first embodiment were drawn two of the adjacent magnets would not be present, therefore there would only be 6 line segments in the simulation for the first embodiment, thus the 8/6 ratio. The magnets of arrays 802-x also double the horizontal field components which are used to levitate the stage. Although the additional magnets of arrays 802-x also increase the weight of the stage, perhaps by as much as 25% assuming that the magnets are half of the total weight of the stage, those additional magnets reduce the current required for levitation by approximately 37% thus the power for levitation by approximately 60% since coils 700, 702 and 704 (see FIG. 7) are not needed in the second embodiment. The power for lateral motion, which is probably substantially less than the power for levitation, is reduced by approximately 30% assuming that the stage in not relocated continuously and the acceleration of such relocations is reasonable.

One might see the added magnets in arrays 802-x in the second embodiment, which occupy positions that were used by coils 700, 702 and 704 in the first embodiment that provided pitch, roll and theta (yaw) control of the stage as a disadvantage. As stated above, and as used herein, theta (yaw) is rotation about the vertical or Z axis, pitch is rotation about the X axis, and roll is rotation about the Y axis.

As an alternate to coils 700, 702 and 704 of the first embodiment, the second embodiment achieves angular control of stage 600 by the technique introduced in FIGS. 12 through 15. Since the total range of angular excursions of stage 600 is typically limited by a laser gauging system to only about a minute of arc, theta, pitch and roll can be achieved by the inclusion of a third and fourth layer of coils on the surface of non-magnetic platen 610 that are discussed below in relation to FIG. 16.

Figure 12:
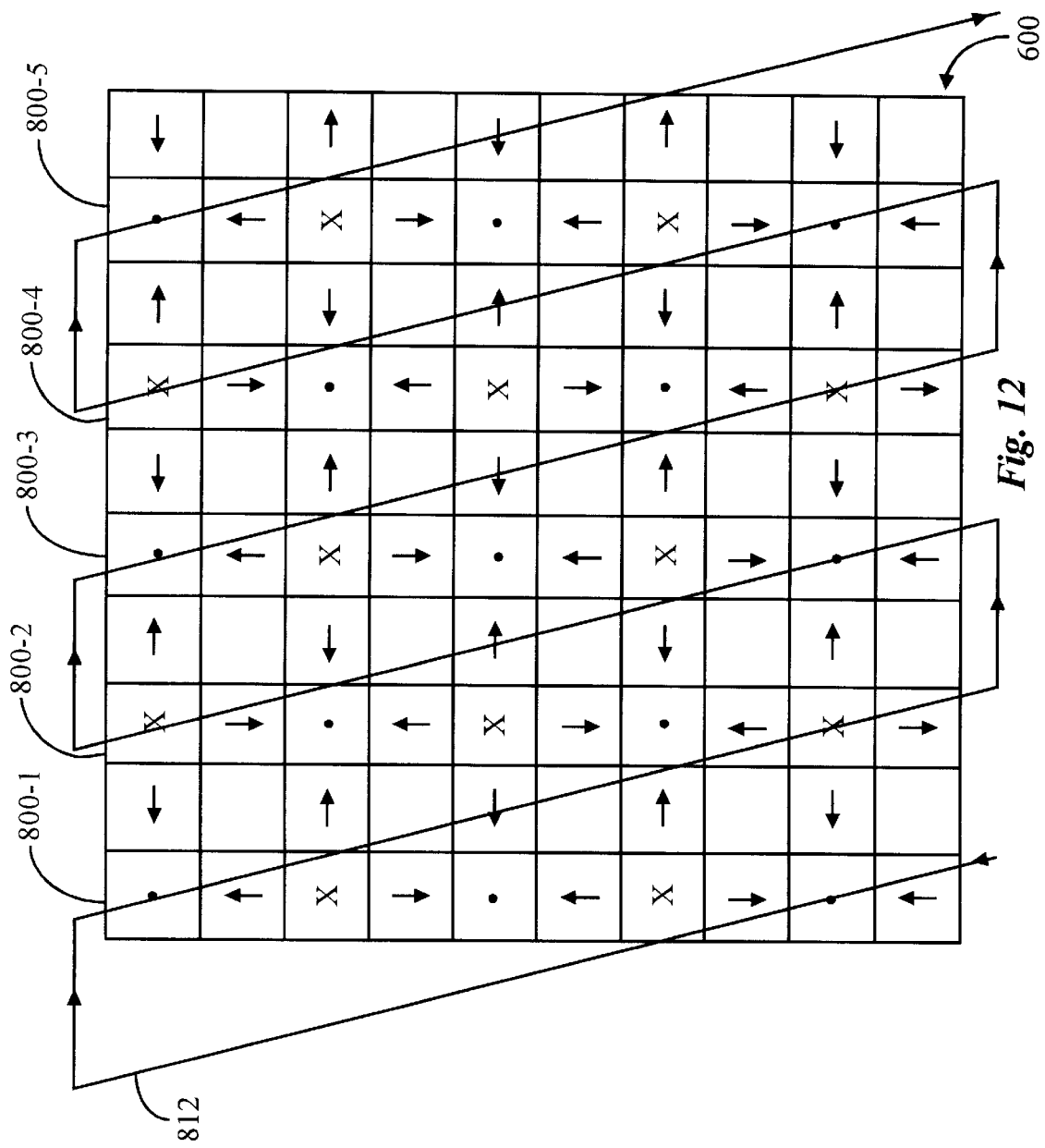
FIG. 12 is a plan view illustrating the cooperative spatial relationship among the two dimensional array of Halbach magnet arrays and a third set of electromagnetic coils to magnetically provide a theta (yaw) positioning control or the X-Y stage in accordance with the principles of the second embodiment of the present invention.

FIG. 12 shows a single strand of wire from a very fine commutated coil 812 superimposed on the stage of the second embodiment of the present invention. The windings of coil 812 are tilted slightly with respect to the Y axis of stage 600 and arranged such that coil 812 is oriented with the magnets in each of arrays 800-x providing a magnetic field in the positive or minus Z directions along the upper edge of the stage and with the magnets in each of arrays 800-x along the lower edge of the stage providing a magnetic field in the opposite Z direction. With coil 812 oriented in that fashion, a current passing through coil 812 creates equal and opposite tangential forces at the top and bottom edges of the stage causing stage 600 to rotate about the Z axis (theta or yaw).

Figure 13:
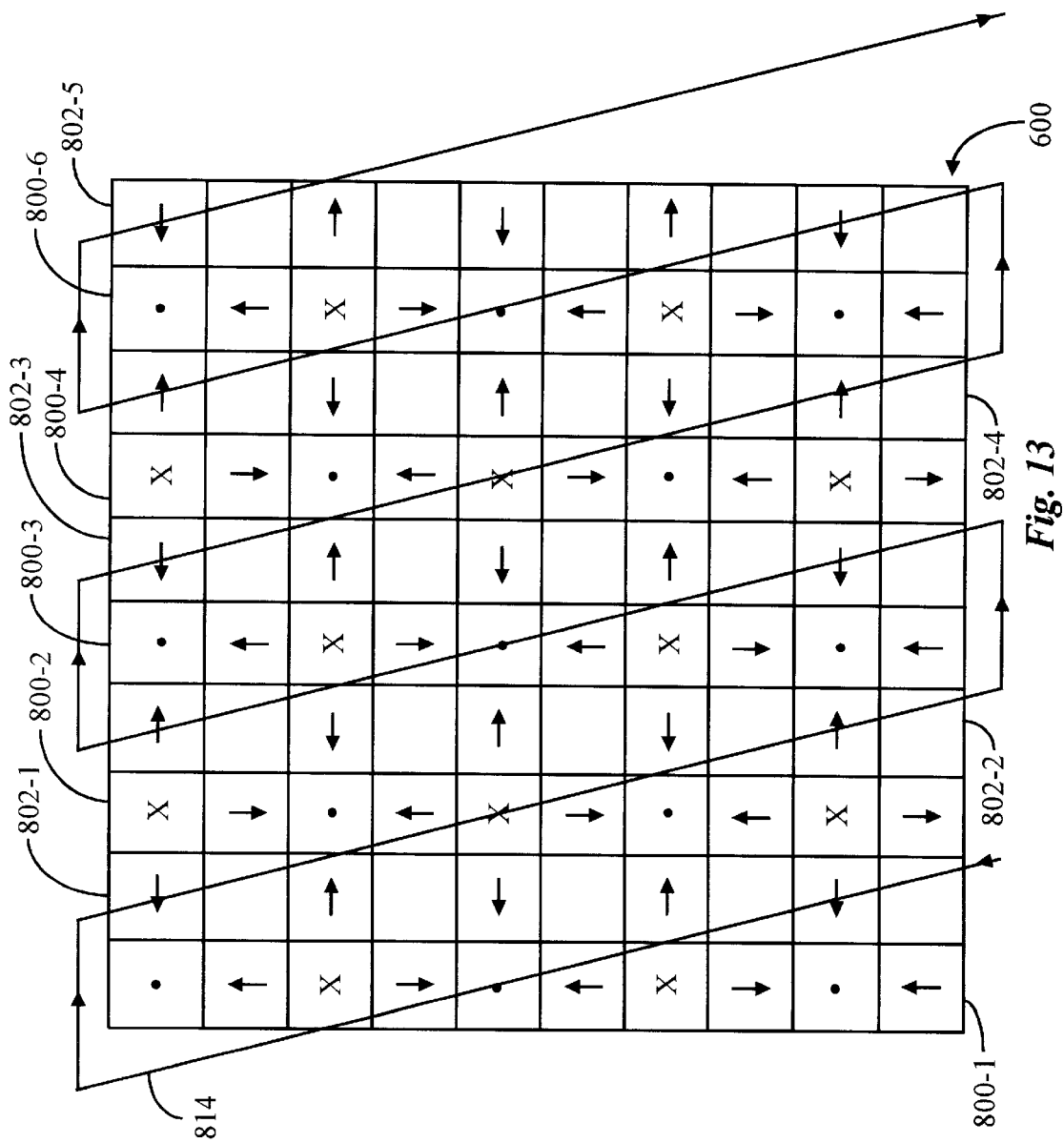
FIG. 13 is a plan view illustrating the cooperative spatial relationship among the two dimensional array of Halbach magnet arrays and a fourth set of electromagnetic coils to magnetically provide a pitch positioning control or the X-Y stage in accordance with the principles of the second embodiment of the present invention.

Then in FIG. 13 a second coil 814 is shown superimposed on the stage of the second embodiment of the present invention. The windings of coil 814 are also tilted slightly with respect to the Y axis of stage 600, at substantially the same angle as coil 812, and arranged mid-way between the windings of coil 812 (see FIG. 12) such that coil 814 is oriented with respect to the magnets in arrays 802-x providing a magnetic field in the plus or minus X directions at opposite edges of the stage (i.e., top and bottom of arrays as shown in FIG. 13). So positioned, coil 814 generates a net force in the Z direction on the upper edge of the stage array and an opposite force on the bottom edge of the stage resulting in a rotation about the X axis (pitch). Given that coils 812 and 814 do not cross over each other beneath stage 600 they can both be included in a third layer of coils on the top of platen 610 and beneath stage 600.

Figure 14:
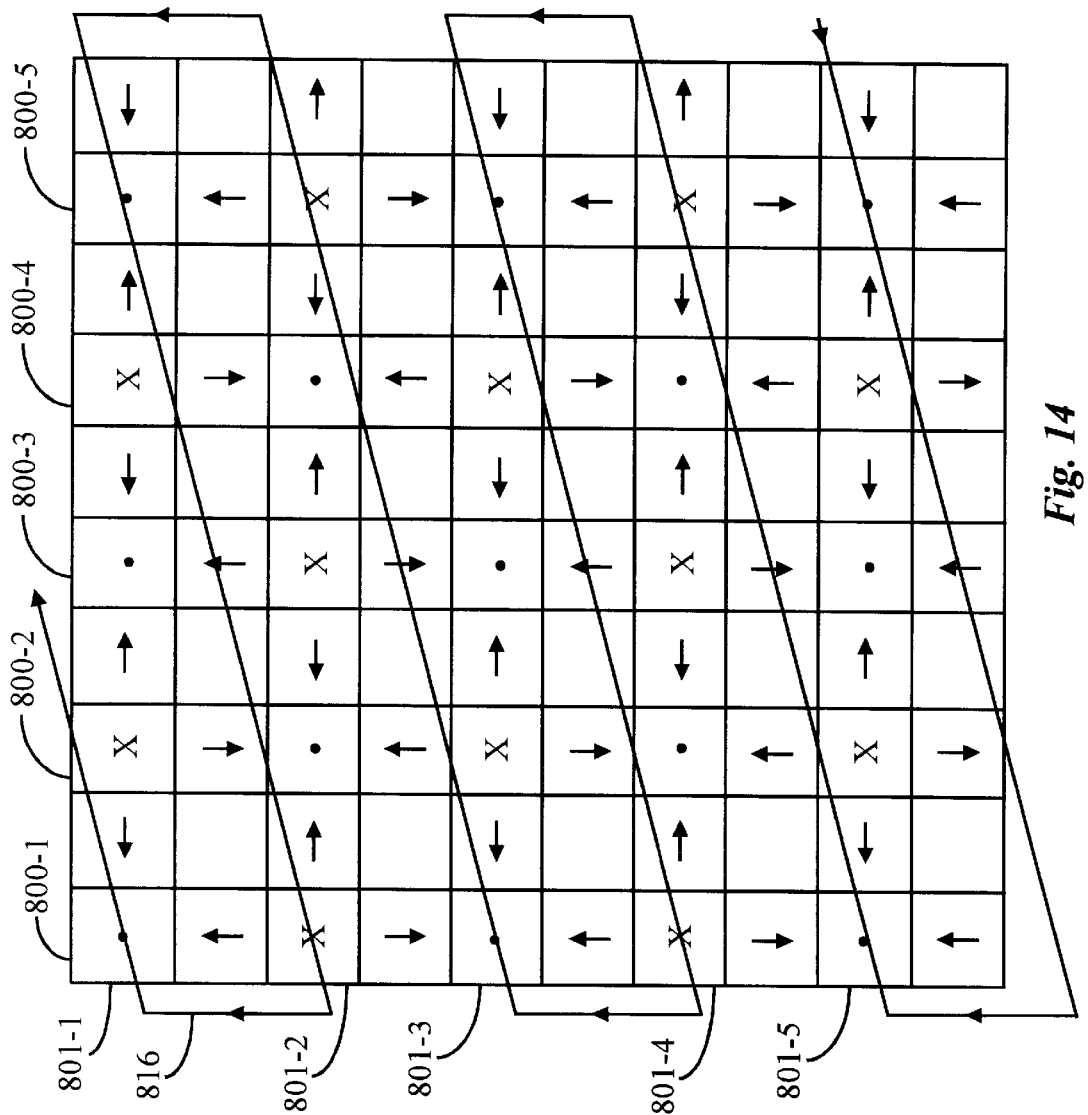
FIG. 14 is a plan view illustrating the cooperative spatial relationship among the two dimensional array of Halbach magnet arrays and a fifth set of electromagnetic coils to magnetically provide a theta positioning control or the X-Y stage in accordance with the principles of the second embodiment of the present invention.

FIG. 14 illustrates a second coil-stage orientation that creates a theta rotation. FIG. 14 shows a single wire from a very fine commutated coil 816 superimposed on the stage of the second embodiment of the present invention. The windings of coil 816 are tilted slightly with respect to the X axis of stage 600 and arranged such that coil 816 is oriented with the magnets providing a magnetic field in the positive and negative Z directions along the right edge of the stage in each of arrays 801-x and with the magnets in each of arrays 801-x providing a magnetic field in the Z directions along the left edge of the stage. With coil 816 oriented in that fashion, a current passing through coil 816 creates equal and opposite tangential forces at the right and left edges of the stage causing stage 600 to rotate about the Z axis (theta or yaw).

Figure 15:
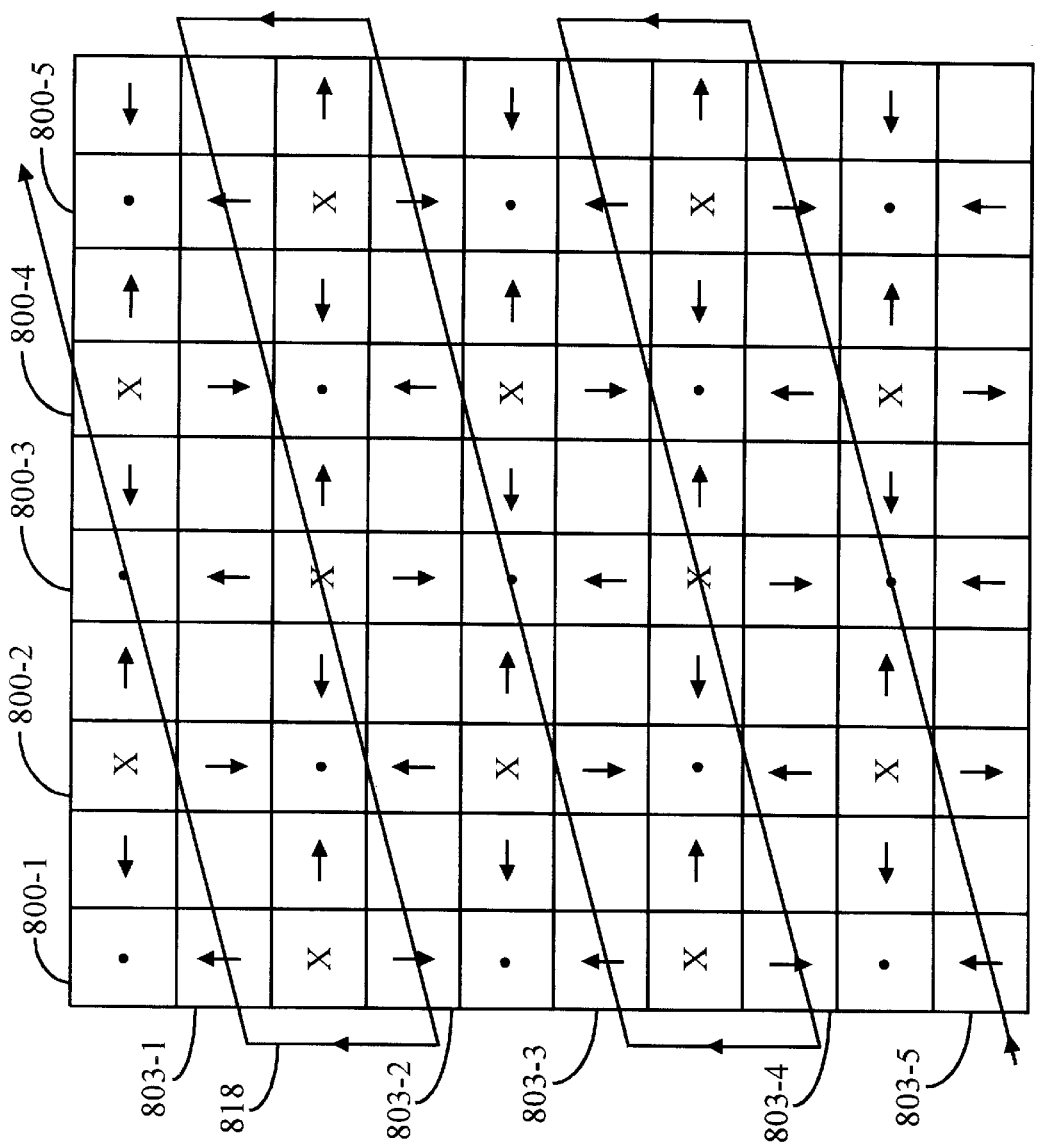
FIG. 15 is a plan view illustrating the cooperative spatial relationship among the two dimensional array of Halbach magnet arrays and a sixth set of electromagnetic coils to magnetically provide a roll positioning control or the X-Y stage in accordance with the principles of the second embodiment of the present invention.

Then in FIG. 15 a fourth coil 818 is shown superimposed on the stage of the second embodiment of the present invention. The windings of coil 818 are also tilted slightly with respect to the X axis of stage 600, at substantially the same angle as coil 816, and arranged mid-way between the windings of coil 816 (see FIG. 14) such that coil 818 is oriented with respect to the magnets in each of arrays 803-x along the left and right edges of the stage providing a magnetic field either in the positive or negative Y direction. So positioned, coil 818 generates a net force in the Z direction on the right edge of the stage and an opposite force on the left edge of the stage resulting in a rotation about the Y axis (roll). Given that coils 816 and 818 do not cross over each other beneath stage 600 they can both be included in a fourth layer of coils on the top of platen 610 and beneath stage 600.

At this point it should be clear that coils 812 and 814 shown in FIGS. 12 and 13, respectively, can be implemented as different commutated sections of a multiple segment, serpentine coil very similar to that shown in FIG. 2, but oriented differently. Similarly coils 816 and 818 shown in FIGS. 14 and 16, respectively, can be implemented as different commutated sections of another multiple segment serpentine coil. By adding two more layers of coils than shown in FIG. 6 pitch, roll and theta control can be added in the second embodiment of the present invention. Given that the forces required for angular control of stage 600 should be small, the system incorporating coils 812, 814, 816 and 818 to control pitch, roll and theta are more than adequate for the task. Thus, in the second embodiment, no wires are required on moveable stage 600 and therefore there is no undesired heat generated in close proximate to wafer 602. In the second embodiment, all the coils are fixed to platen 610 and any heat generated by those coils, as well as positioning coils 500 and 502 can be easily removed by cooling the platen or by other means.

It should also be noted that the angular orientation of the angular correction coils 812–818 need not necessarily be constrained to the positions shown in FIGS. 12 through 15. For example, with the magnet array shown, a similar result can be achieved with angles that slightly depart from 45° as well.

Figure 16:
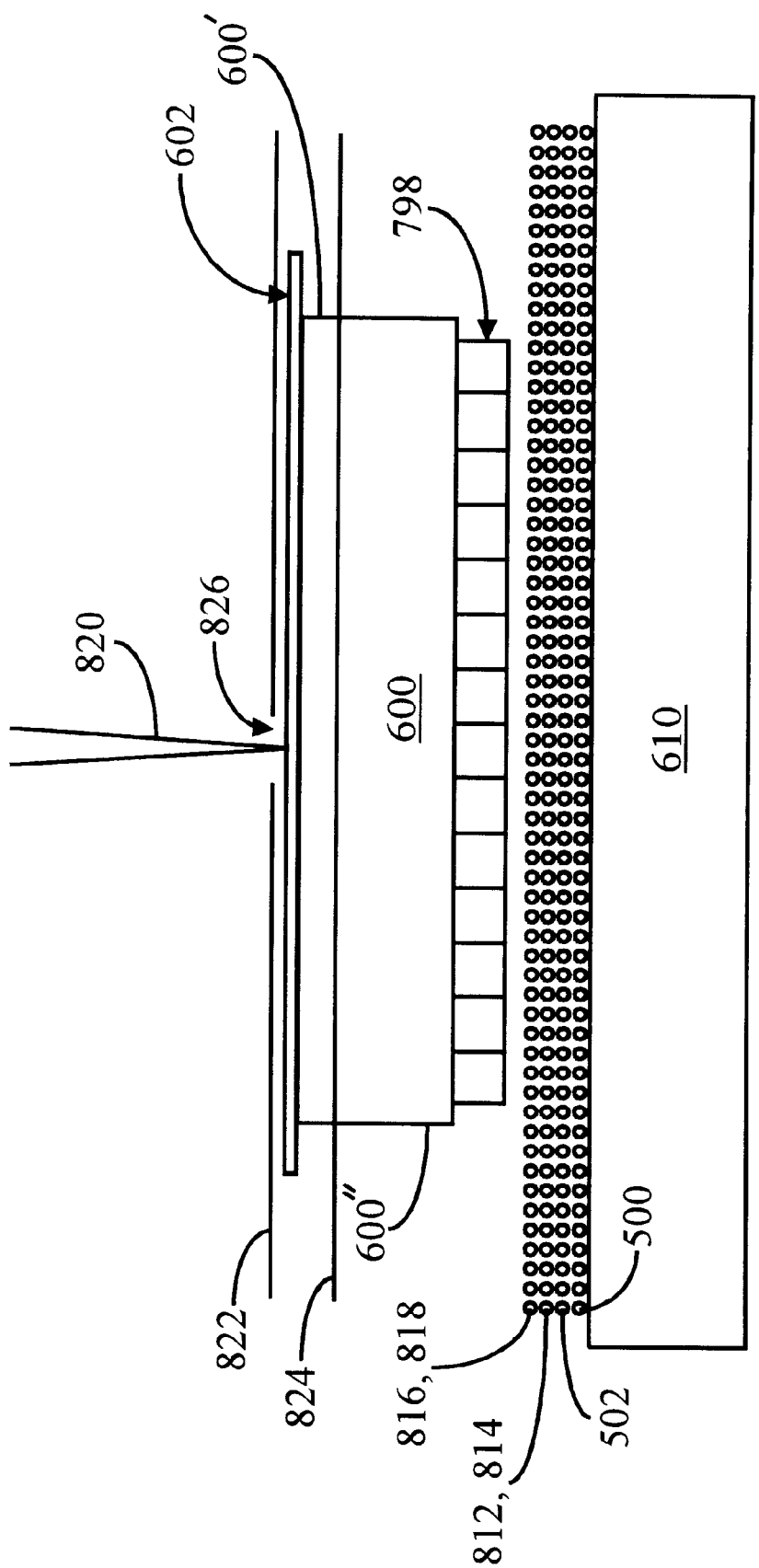
FIG. 16 shows a second preferred embodiment of the present invention, which illustrates a side view of the spatial configuration among the electron beam (e-beam), the wafer, the magnetic shielding for the wafer, the wafer support X-Y stage, and the magnetic positioning apparatus therefor.

Normally the motors used to drive a stage in an e-beam, ion beam or photon beam system are not housed in the vacuum chamber with the beam source since stray magnetic fluxes from those motors could cause havoc with the precisely directed beam. In FIG. 16 there is shown a stage adapted for e-beam, ion beam and photon beam applications. In FIG. 16 there is shown a beam 820 directed to wafer 610 through a small opening in a first magnetic shield 822 situated between the beam source (not shown) and wafer 602. Wafer 602 is mounted on stage 600 with the two dimensional array of Halbach magnet arrays 798 mounted on the lower surface of stage 600. Then on non-magnetic platen 610 there is mounted up to four layers of control coils: one layer for coils 500; another layer for coils 502; yet another layer for coils 812 and 814; and one more layer for coils 816 and 818. To further minimize any stray magnetic influence from array 798 and control coils 500, 502, 812, 814, 816 and 818, a second magnetic shield 824 can be sandwiched between an upper and a lower portion 600' and 600", respectfully, of stage 600, with second shield 824 occupying the interior portion of stage 600 and extending outward and away a sufficient distance from the outer side surfaces of stage 600. The ability to shield the beam from the magnetic levitating stage of the present invention is more readily possible due to the magnetic fields of the stage being so well constrained even without the shielding.

As was the case with the first embodiment, the second embodiment the cross-section of each of the permanent magnets of the Halbach magnet arrays has been described as being a square and the various coil wires being inclined at certain angles with respect to the X and Y axes. However, more generally, all that is required is that the shape of the cross-section of each of the magnets of the Halbach magnet arrays be symmetrical with respect to each of the X and Y axes. This includes, by way of examples, magnets with circular cross-sections. If the array of identically-poled magnets forms a rectangular, rather than a square, grid, then the orientation of the wires must be changed so that a wire passing through the center of one magnet also traverses the center of the other similarly oriented magnets. Therefore, in this latter case, it is necessary to appropriately adjust the relative magnitudes of the energizing currents applied, respectively, to the lateral-force producing coil wires of each of the first and second sets in order to compensate for the fact that the X and Y components of lateral force are inherently unequal in magnitude to one another. Further, electromagnets may be substituted for the permanent magnets of the Halbach magnet arrays.

While several specific examples of the various embodiments of the present invention have been given above, the scope of the claims is not limited to those specific embodiments. The scope of the claims rather includes all embodiments mentioned herein as well as equivalents of those embodiments regardless of their actual configuration.

What is claimed is:

1. An overall magnet array defining an X-Y-Z coordinate system with each axis perpendicular to each other axis, each magnet having a particular magnetic field orientation and being substantially the same size and shape as every other magnet, said overall magnet array comprising:

a first Halbach magnet array, in the form of a first column in an X-Y plane aligned parallel to said Y-axis, said first Halbach magnet array having:

a first magnet oriented with said magnetic field extending vertically upward therefrom parallel to said Z-axis;

a second magnet adjacent said first magnet with said magnetic field extending horizontally away from said first magnet parallel to said Y-axis;

a third magnet adjacent said second magnet with said magnetic field extending vertically downward therefrom parallel to said Z-axis; and a fourth magnet adjacent said third magnet with said magnetic field extending horizontally toward said third magnet parallel to said Y-axis; and a second Halbach magnet array, in the form of a second column in the same X-Y plane as said first column, aligned parallel to said Y-axis and spaced apart from said first column a width of a single magnet in the direction of the X-axis, said second Halbach magnet array having:

a fifth magnet aligned opposite said first magnet in said first column with said magnetic field extending vertically downward therefrom parallel to said Z-axis;

a sixth magnet adjacent said fifth magnet and opposite said second magnet in said first column with said magnetic field extending horizontally toward said fifth magnet parallel to said Y-axis;

a seventh magnet adjacent said sixth magnet and opposite said third magnet in said first column with said magnetic field extending vertically upward therefrom parallel to said Z-axis; and an eighth magnet adjacent said seventh magnet and opposite said fourth magnet in said first column with said magnetic field extending horizontally away from said seventh magnet parallel to said Y-axis;

wherein each of said magnets has an upper and a lower lateral extent in reference to said Y-axis with the upper and lower lateral extent of each magnet in said second column being aligned with the upper and lower lateral extent of the magnet in said first column that the magnet in said second column is opposite.

2. The overall magnet array as in claim 1 wherein said array can be expanded by adding one or more columns of magnets opposite, and parallel to, said first and second columns with a repeating pattern of columns having the same make up and in the same order as said first and second columns with each column of magnets being spaced apart from the closest neighbor columns by a width of a single magnet in the direction of the X-axis.

3. The overall magnet array as in claim 1 wherein said array can be expanded by adding one or more magnets adjacent either end of a column of magnets preserving the same alternating pattern of magnet field orientations of the column.

4. The overall magnet array as in claim 1 wherein each magnet has a square cross-section in the X-Y plane.

5. The overall magnet array as in claim 1 wherein each magnet has a circular cross-section in the X-Y plane.

6. The overall magnet array as in claim 1 wherein each magnet has an elliptical cross-section in the X-Y plane.

7. The overall magnet array of claim 1 wherein each magnet is an electro-magnet.

8. The overall magnet array of claim 1 wherein each magnet is a permanent magnet.

9. An overall magnet array defining an X-Y-Z coordinate system with each axis perpendicular to each other axis, each magnet having a particular magnetic field orientation and being substantially the same size and shape as every other magnet, said overall magnet array comprising:

a first Halbach magnet array, in the form of a first column in an X-Y plane aligned parallel to said Y-axis, said first Halbach magnet array having:

a first magnet oriented with said magnetic field extending vertically upward therefrom parallel to said Z-axis;

a second magnet adjacent said first magnet with said magnetic field extending horizontally toward said first magnet parallel to said Y-axis;

a third magnet adjacent said second magnet with said magnetic field extending vertically downward therefrom parallel to said Z-axis; and a fourth magnet adjacent said third magnet with said magnetic field extending horizontally away from said third magnet parallel to said Y-axis;

a second Halbach magnet array, in the form of a second column in the same X-Y plane as said first column, aligned parallel to said Y-axis and spaced apart from said first column a width of a single magnet in the direction of the X-axis, said second Halbach magnet array having:

a fifth magnet aligned opposite said first magnet in said first column with said magnetic field extending vertically downward therefrom parallel to said Z-axis;

a sixth magnet adjacent said fifth magnet opposite said second magnet in said first column with said magnetic field extending horizontally away from said fifth magnet parallel to said Y-axis;

a seventh magnet adjacent said sixth magnet and opposite said third magnet in said first column with said magnetic field extending vertically upward therefrom parallel to said Z-axis; and an eighth magnet adjacent said seventh magnet and opposite said fourth magnet in said first column with said magnetic field extending horizontally toward from said seventh magnet parallel to said Y-axis;

a third column of magnets in the same X-Y plane as said first and second columns, aligned parallel to said Y-axis and located between, and adjacent to, each of said first and second columns, said third column of magnets having:

a ninth magnet between, and adjacent, to both of said first and fifth magnets with said magnetic field extending horizontally toward said first magnet parallel to said X-axis; and a tenth magnet between, and adjacent to, each of said third and seventh magnets with said magnetic field extending horizontally away from said third magnet parallel to said X-axis; and a fourth column of magnets in the same X-Y plane as said first, second and third columns, aligned parallel to said Y-axis and located adjacent to said second column on the side of said second column away from said first column, said fourth column of magnets having:

an eleventh magnet adjacent to said fifth magnet with said magnetic field extending horizontally away from said fifth magnet parallel to said X-axis; and a twelfth magnet adjacent to said seventh magnet with said magnetic field extending horizontally toward said seventh magnet parallel to said X-axis;

wherein each of said magnets has a upper and a lower lateral extent in reference to said Y-axis with the upper and lower lateral extent of each magnet in said second column being aligned with the upper and lower lateral extent of the magnet in said first column that the magnet in said second column is opposite, and the upper and lower lateral extent of said ninth, tenth, eleventh and twelfth magnets in said third and fourth columns, respectively, being aligned with the upper and lower lateral extent of each magnet in said first or second column that said magnet is said to be adjacent.

10. The overall magnet array as in claim 9 wherein said array is expanded by adding one or more columns of magnets in the X direction adjacent the first or fourth column with a repeating pattern of columns having the same make up and in the same order as said first, second, third and fourth columns.

11. The overall magnet array as in claim 9 wherein said array is expanded by adding one or more magnets in the Y direction in one or more adjacent columns with a repeating pattern in each column that complements and maintains the repeating pattern of the column having the same make up and in the same order.

12. The overall magnet array as in claim 9 wherein each magnet has a square cross-section in the X-Y plane.

13. The overall magnet array as in claim 9 wherein each magnet has a circular cross-section in the X-Y plane.

14. The overall magnet array as in claim 9 wherein each magnet is an electro-magnet.

15. The overall magnet array as in claim 9 wherein each magnet is a permanent magnet.

16. The overall magnet array as in claim 9 is a two dimensional Halbach magnet array.

17. An apparatus for magnetically positioning a movable X-Y stage with respect to X and Y horizontal axes and a Z vertical axis that comprises:

a first commutated coil of wire that lies substantially in a first horizontal X-Y plane and is angularly offset in said first horizontal X-Y plane by minus a first oblique angle with respect to said Y axis;

a second commutated coil of wire that lies substantially in a second horizontal X-Y plane substantially in vertical alignment with said first horizontal X-Y plane and angularly offset in said second horizontal X-Y plane by plus a second oblique angle with respect to said X axis;

a first set of a plurality of flat stationary electromagnetic coils of wire that lie substantially in said first horizontal X-Y plane mid-way between the windings of said first commutated coil of wire and are angularly offset in said first horizontal X-Y plane by minus said first oblique angle with respect to said Y axis;

a second set of a plurality of flat stationary electromagnetic coils of wire that lie substantially in said second horizontal X-Y plane mid-way between the windings of said second commutated coil of wire and are angularly offset in said second horizontal X-Y plane by minus said second oblique angle with respect to said X axis;

a two dimensional array of Halbach magnet arrays attached to said movable X-Y stage, wherein said array substantially lies in a third horizontal X-Y plane, is oriented substantially parallel to the same one of said X and Y horizontal axes with respect to which said first and second oblique angles are measured, and is simultaneously situated in a cooperative relationship with both of said first and second commutated coils of wire, and said first and second set of electromagnetic coils of wire; and means for levitating said two dimensional array of Halbach magnet arrays in said third X-Y plane;

wherein tangential forces are applied to said X-Y stage to produce a variation of the theta/yaw of said X-Y stage by said first and second commutated coils of wire, vertical forces are applied to said X-Y stage to produce a variation of the roll of said X-Y stage about the Y axis by said first set of electromagnetic coils of wire, and vertical forces are applied to said X-Y stage to produce a variation of the pitch of said X-Y stage about the X axis by said second set of electromagnetic coils of wire wherein said forces may be selectively generated in accordance with the phase and magnitude of current energizing a wire of some of each of said coils of wire.

18. The apparatus as in claim 17 wherein said means for levitating comprises:

a third set of a plurality of flat stationary electromagnetic coils of wire that substantially lie in a third horizontal X-Y plane substantially in vertical alignment with said first and second horizontal X-Y planes and are angularly offset in said third horizontal X-Y plane by plus a third oblique angle with respect to a given one of said X and Y horizontal axes; and a fourth set of a plurality of flat stationary electromagnetic coils of wire that substantially lie in a fourth horizontal X-Y plane substantially in vertical alignment with said first, second and third horizontal X-Y planes and are angularly offset in said fourth horizontal X-Y plane by minus said third oblique angle with respect to the same one of said X and Y horizontal axes as said third set of coils of wire;

wherein a lateral force in said X and/or Y horizontal directions and/or a vertical force in said vertical Z direction may be selectively generated in accordance with the phase and magnitude of current energizing a wire of some of each of said plurality of flat stationary electromagnetic coils of said third and fourth sets.

19. The apparatus as in claim 18, wherein said given third oblique angle is substantially 45°.

20. The apparatus as in claim 18, wherein magnets of said Halbach magnet array are permanent magnets.

21. The apparatus as in claim 20 wherein:

each permanent magnet has a square cross-section; and said third oblique angle is substantially 45°.

22. The apparatus as in claim 21, wherein said movable X-Y stage is a wafer support X-Y stage in the form of a foreshortened cylinder having said two dimensional array of Halbach magnet arrays of permanent magnets attached to the bottom thereof.

23. The apparatus as in claim 22, wherein said wafer support X-Y stage is in the form of a foreshortened circular cylinder having said two dimensional array of Halbach magnet arrays of permanent magnets attached to the bottom thereof.

24. The apparatus as in claim 22, wherein said foreshortened cylinder of said wafer support X-Y stage has lateral dimensions of at least 200 millimeters.

25. The apparatus as in claim 22, further comprising:

a ferromagnetic platen; and a non-magnetic adhesive for attaching said first, second, third and fourth layers of coils of wire to said platen.

26. The apparatus as in claim 25, wherein each of said third and fourth sets of flat stationary electromagnetic coils of wire comprises at least four adjacent individually commutable coil wires arranged such that each magnet of said two dimensional array of Halbach magnet arrays at any one time is in cooperative relationship with a first subset of at least one of said commutable coil wires of said third set and a second subset of at least one of said commutable coil wires of said fourth set.

27. The apparatus as in claim 26, wherein the number of said commutable coil wires of each of said third and fourth sets is six.

28. The apparatus as in claim 17, wherein said two dimensional array of Halbach magnet arrays comprising:

an overall magnet array defining an X-Y-Z coordinate system with each axis perpendicular to each other axis, each magnet having a particular magnetic field orientation and being substantially the same size and shape as every other magnet, said overall magnet array having:

a first Halbach magnet array, in the form of a first column in said X-Y plane aligned parallel to said Y-axis, said first Halbach magnet array having:

a first magnet oriented with said magnetic field extending vertically upward therefrom parallel to said Z-axis;

a second magnet adjacent said first magnet with said magnetic field extending horizontally toward said first magnet parallel to said Y-axis;

a third magnet adjacent said second magnet with said magnetic field extending vertically downward therefrom parallel to said Z-axis; and a fourth magnet adjacent said third magnet with said magnetic field extending horizontally away from said third magnet parallel to said Y-axis;

a second Halbach magnet array, in the form of a second column in the same X-Y plane as said first column, aligned parallel to said Y-axis and spaced apart from said first column a width of a single magnet in the direction of the X-axis, said second Halbach magnet array having:
- a fifth magnet aligned opposite said first magnet in said first column with said magnetic field extending vertically downward therefrom parallel to said Z-axis;
- a sixth magnet adjacent said fifth magnet and opposite said second magnet in said first column with said magnetic field extending horizontally away from said fifth magnet parallel to said Y-axis;
- a seventh magnet adjacent said sixth magnet and opposite said third magnet in said first column with said magnetic field extending vertically upward therefrom parallel to said Z-axis; and
- an eighth magnet adjacent said seventh magnet and opposite said fourth magnet in said first column with said magnetic field extending horizontally toward from said seventh magnet parallel to said Y-axis;

a third column of magnets in the same X-Y plane as said first and second columns, aligned parallel to said Y-axis and located between, and adjacent to, each of said first and second columns, said third column of magnets having:
- a ninth magnet between, and adjacent, to both of said first and fifth magnets with said magnetic field extending horizontally toward said first magnet parallel to said X-axis; and
- a tenth magnet between, and adjacent to, each of said third and seventh magnets with said magnetic field extending horizontally away from said third magnet parallel to said X-axis; and a fourth column of magnets in the same X-Y plane as said first, second and third columns, aligned parallel to said Y-axis and located adjacent to said second column on the side of said second column away from said first column, said fourth column of magnets having:
- an eleventh magnet adjacent to said fifth magnet with said magnetic field extending horizontally away from said fifth magnet parallel to said X-axis; and
- a twelfth magnet adjacent to said seventh magnet with said magnetic field extending horizontally toward said seventh magnet parallel to said X-axis;

wherein each of said magnets has an upper and a lower lateral extent in reference to said Y-axis with the upper and lower lateral extent of each magnet in said second column being aligned with the upper and lower lateral extent of the magnet in said first column that the second column is opposite, and the upper and lower lateral extent of said ninth, tenth, eleventh and twelfth magnets in said third and fourth columns, respectively, being aligned with the upper and lower lateral extent of each magnet in said first or second column that said magnet is said to be adjacent.

29. The apparatus as in claim 28 wherein said two dimensional array of Halbach magnet arrays is expanded by adding one or more columns of magnets in the X direction adjacent the first or fourth column with a repeating pattern of columns having the same make up and in the same order as said first, second, third and fourth columns.

30. The apparatus as in claim 28 wherein said two dimensional array of Halbach magnet arrays is expanded by adding one or more magnets in the Y direction in one or more adjacent columns with a repeating pattern in each column that complements and maintains the repeating pattern of the column having the same make up and in the same order.

31. The apparatus as in claim 28 wherein each magnet has a square cross-section in the X-Y plane.

32. The apparatus as in claim 28 wherein each magnet has a circular cross-section in the X-Y plane.

33. The apparatus as in claim 28 wherein each magnet is an electro-magnet.

34. The apparatus as in claim 28 wherein each magnet is a permanent magnet.

35. The apparatus as in claim 28 wherein:
minus said first oblique angle is selected to orient:
- said first commutated coil of wire with one of said magnets near each of the two extremes of said overall magnet array in the Y direction in each of said Halbach magnet arrays which provide a magnetic field in each of the positive and negative Z directions; and
- said first plurality of electromagnetic coils with one of said magnets near each of the two extremes of said overall magnet array in the Y direction in each of columns of magnets which provide a magnetic field in each of the positive and negative X directions; and plus said second oblique angle is selected to orient:
- said second commutated coil of wire with one of said magnets near each of the two extremes of said overall magnet array in the X direction in each of said Halbach magnet arrays which provide a magnetic field in each of the positive and negative Z directions; and
- said second plurality of electromagnetic coils with one of said magnets near each of the two extremes of said overall magnet array in the X direction in each of columns of magnets which provide a magnetic field in each of the positive and negative Y directions.

* * * * *